United States Patent
Ishibashi

(10) Patent No.: US 7,643,345 B2
(45) Date of Patent: Jan. 5, 2010

(54) SEMICONDUCTOR MEMORY DEVICE WHICH INCLUDES STACKED GATE HAVING CHARGE ACCUMULATION LAYER AND CONTROL GATE

(75) Inventor: Shigeru Ishibashi, Kawasaki (JP)

(73) Assignee: Kabushiki Kaisha Toshiba, Tokyo (JP)

(*) Notice: Subject to any disclaimer, the term of this patent is extended or adjusted under 35 U.S.C. 154(b) by 12 days.

(21) Appl. No.: 11/961,398

(22) Filed: Dec. 20, 2007

(65) Prior Publication Data
US 2008/0158964 A1    Jul. 3, 2008

(51) Int. Cl.
*G11C 11/34* (2006.01)
(52) U.S. Cl. .................. 365/185.13; 365/185.24
(58) Field of Classification Search ............. 365/185.13, 365/185.24
See application file for complete search history.

(56) References Cited

U.S. PATENT DOCUMENTS

2001/0040292 A1* 11/2001 Hahn et al. ............... 257/750
2002/0081799 A1* 6/2002 Kim ........................ 438/233
2005/0101081 A1   5/2005 Goda et al.
2006/0231822 A1* 10/2006 Kim ........................ 257/1
2007/0170589 A1   1/2007 Kato et al.

FOREIGN PATENT DOCUMENTS

JP   2002-151601   5/2002
JP   2002-313970   10/2002

* cited by examiner

*Primary Examiner*—Michael T Tran
(74) *Attorney, Agent, or Firm*—Oblon, Spivak, McClelland, Maier & Neustadt, L.L.P.

(57) ABSTRACT

A semiconductor memory device includes memory cells, a memory cell array, a contact region, and first contact plugs. The memory cells include a control gate and a current path. The memory cells are arranged in the memory cell array in the first direction. The contact region is adjacent to the memory cell array in a second direction orthogonal to the first direction. A terminal portion on one end of the control gate is drawn onto the contact region from within the memory cell array. Each of the first contact plugs is formed on the control gate located in the contact region. The first contact plugs are located so as to alternately sandwich a first axis in the first direction.

18 Claims, 29 Drawing Sheets

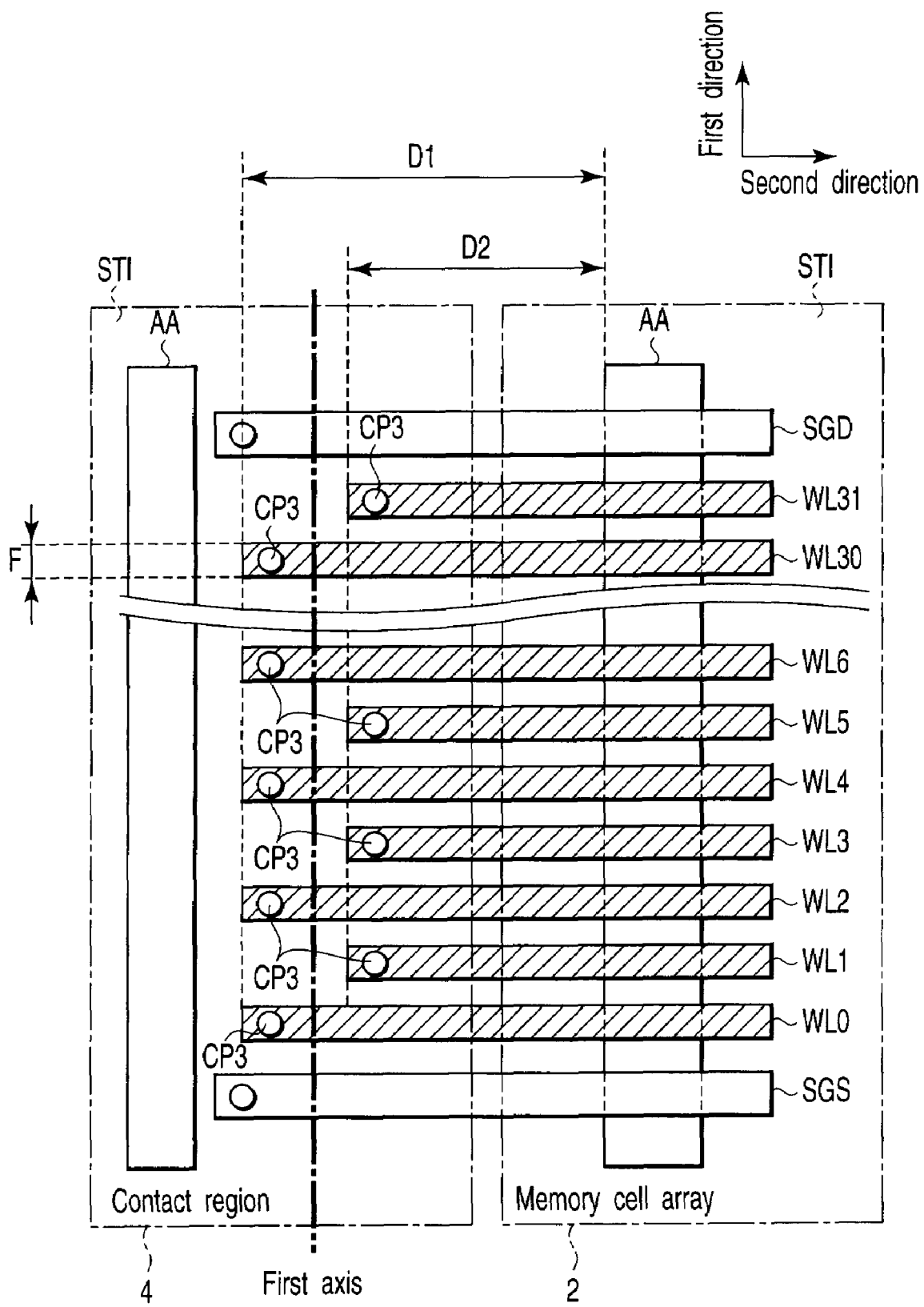
F I G. 3

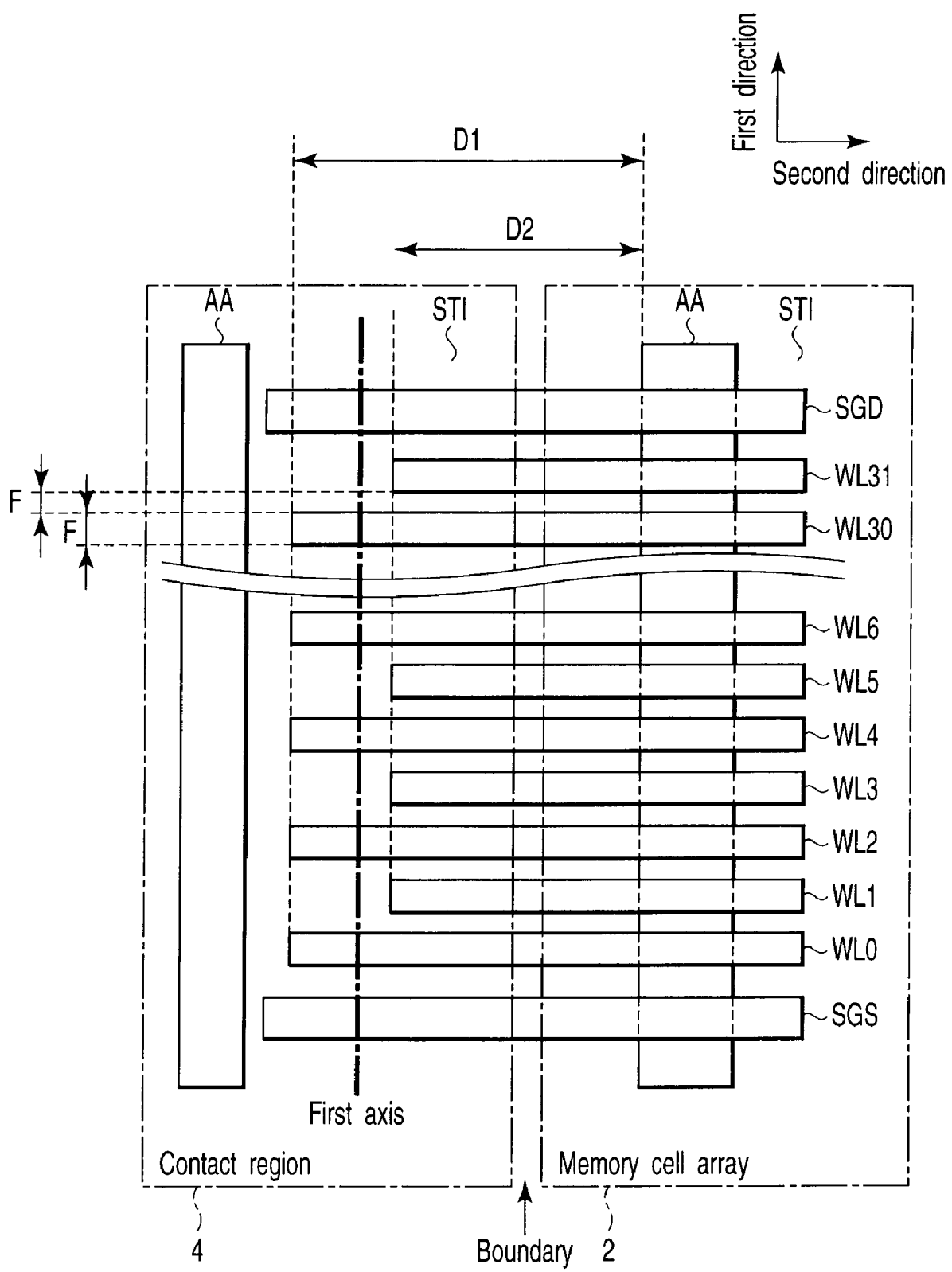
F I G. 6

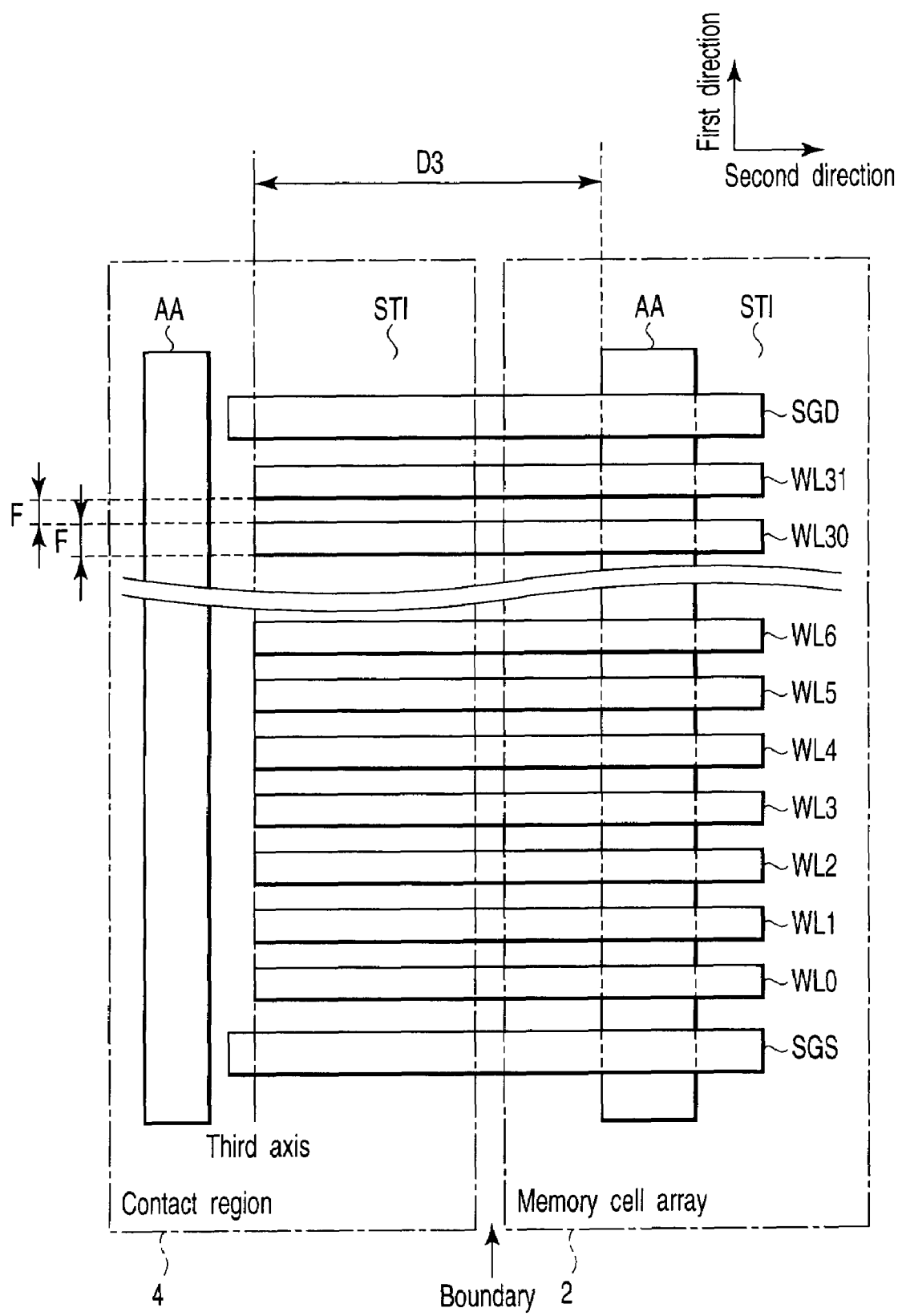
F I G. 13

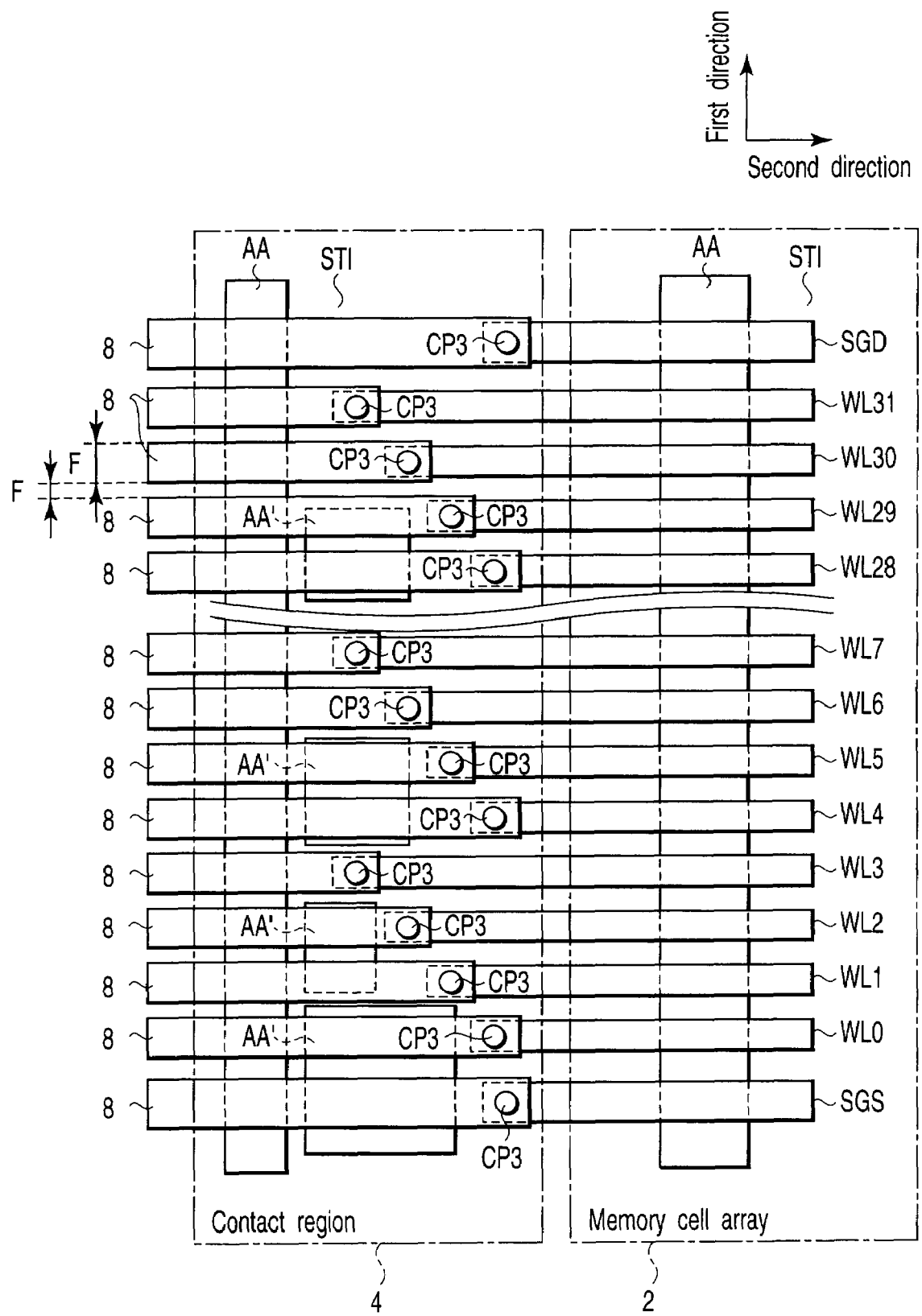
F I G. 21

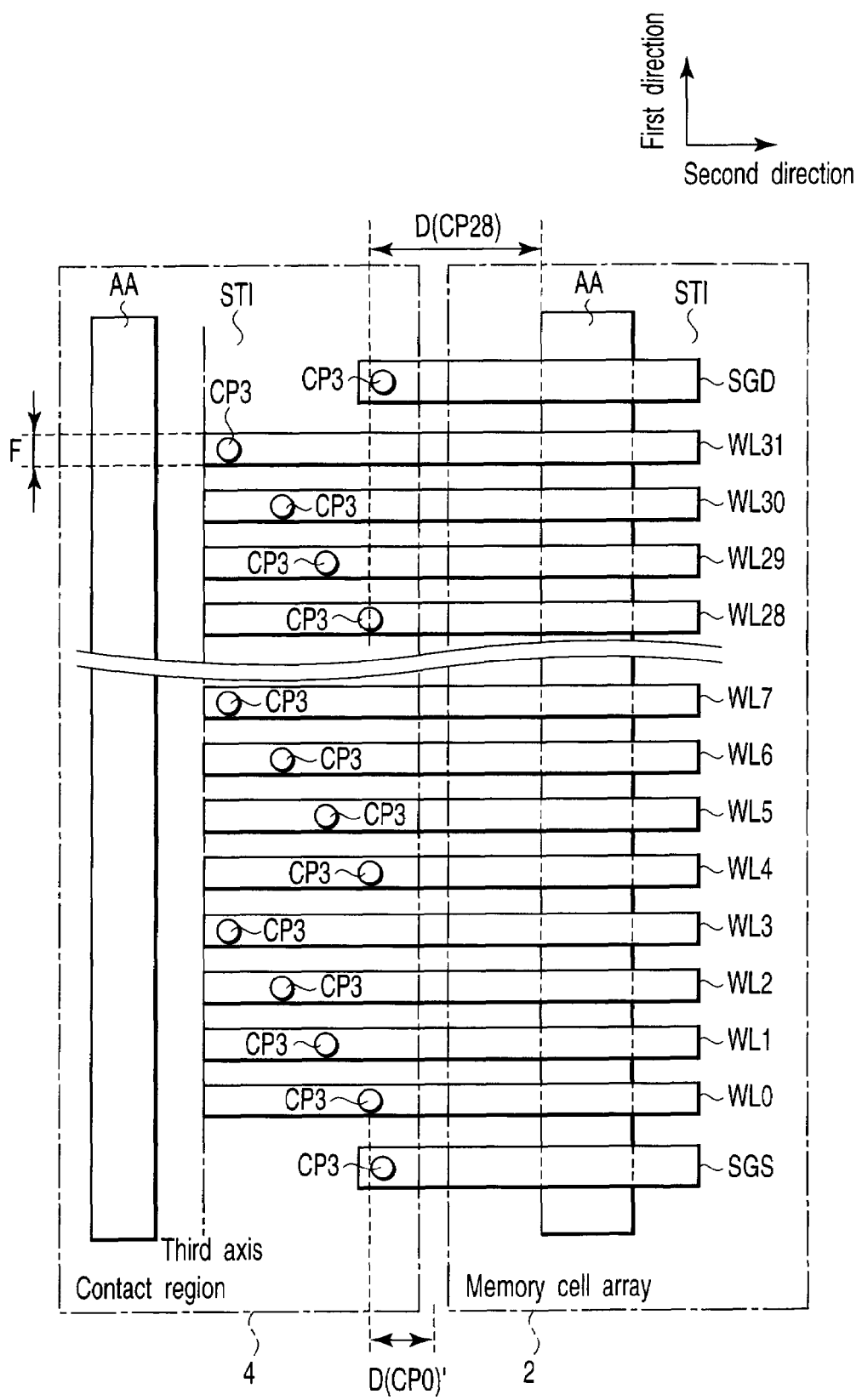
F I G. 23

SEMICONDUCTOR MEMORY DEVICE WHICH INCLUDES STACKED GATE HAVING CHARGE ACCUMULATION LAYER AND CONTROL GATE

CROSS-REFERENCE TO RELATED APPLICATIONS

This application is based upon and claims the benefit of priority from prior Japanese Patent Application No. 2006-353420, filed Dec. 27, 2006, the entire contents of which are incorporated herein by reference.

BACKGROUND OF THE INVENTION

1. Field of the Invention

The present invention relates to a semiconductor memory device, particularly to a semiconductor memory device provided with a stacked gate including a charge accumulation layer and a control gate.

2. Description of the Related Art

Conventionally, there is known a NAND type EEPROM (Electrically Erasable and Programmable Read Only Memory) as a nonvolatile semiconductor memory. In the NAND type EEPROM, plural memory cell transistors whose current paths are connected in series to form a memory cell unit (hereinafter, referred to as a NAND string). Recently, the number of word lines included in one NAND string tends to be increased due to the growing demands for higher levels of integration.

The word line is drawn to the outside of a memory cell array and connected to a row decoder through a contact plug. At this point, the word line is processed such that a width of the word line attains a minimum processing dimension F. For example, Jpn. Pat. Appln. KOKAI Publication No. 2002-151601 proposes a layout in which misalignment in photolithography is taken into account to prevent breaking or short-circuit of the word line or contact plug.

However, in the configuration disclosed in Jpn. Pat. Appln. KOKAI Publication No. 2002-151601, an area of a contact plug forming region where the word line and the row decoder are connected is increased because the misalignment is taken into account. Therefore, a chip area tends to be increased.

BRIEF SUMMARY OF THE INVENTION

A semiconductor memory device according to an aspect of the present invention includes:

memory cells each of which includes a stacked gate and a current path, the stacked gate including a charge accumulation layer and a control gate, the charge accumulation layer being formed on a semiconductor substrate with a first insulating film interposed therebetween, the control gate being formed on the charge accumulation layer with a second insulating film interposed therebetween;

a memory cell array in which the memory cells are arranged such that the current path of each of the memory cells is provided in the first direction;

a contact region which is adjacent to the memory cell array in a second direction orthogonal to the first direction, the contact region including an element insulating region formed on the semiconductor substrate, a terminal portion on one end of the control gate being drawn onto the element insulating region from within the memory cell array; and first contact plugs each of which is formed on the control gate located on the element insulating region in the contact region, the first contact plugs being located so as to alternately sandwich a first axis in the first direction in the contact region.

BRIEF DESCRIPTION OF THE SEVERAL VIEWS OF THE DRAWING

FIG. 3 is a plan view showing the memory cell array, row decoder, and contact region which are included in the flash memory according to the first embodiment;

FIGS. 6 to 8 are plan views showing first to third processes of producing the flash memory according to the first embodiment;

FIGS. 13 to 15 are sectional views showing first to third processes of producing the flash memory according to the second embodiment;

FIGS. 19 to 21 are plan views showing first to third processes of producing the flash memory according to the third embodiment;

FIG. 23 is a plan view showing a memory cell array and a contact region which are included in a flash memory according to a modification of the third embodiment;

DETAILED DESCRIPTION OF THE INVENTION

First Embodiment

Figure 1:
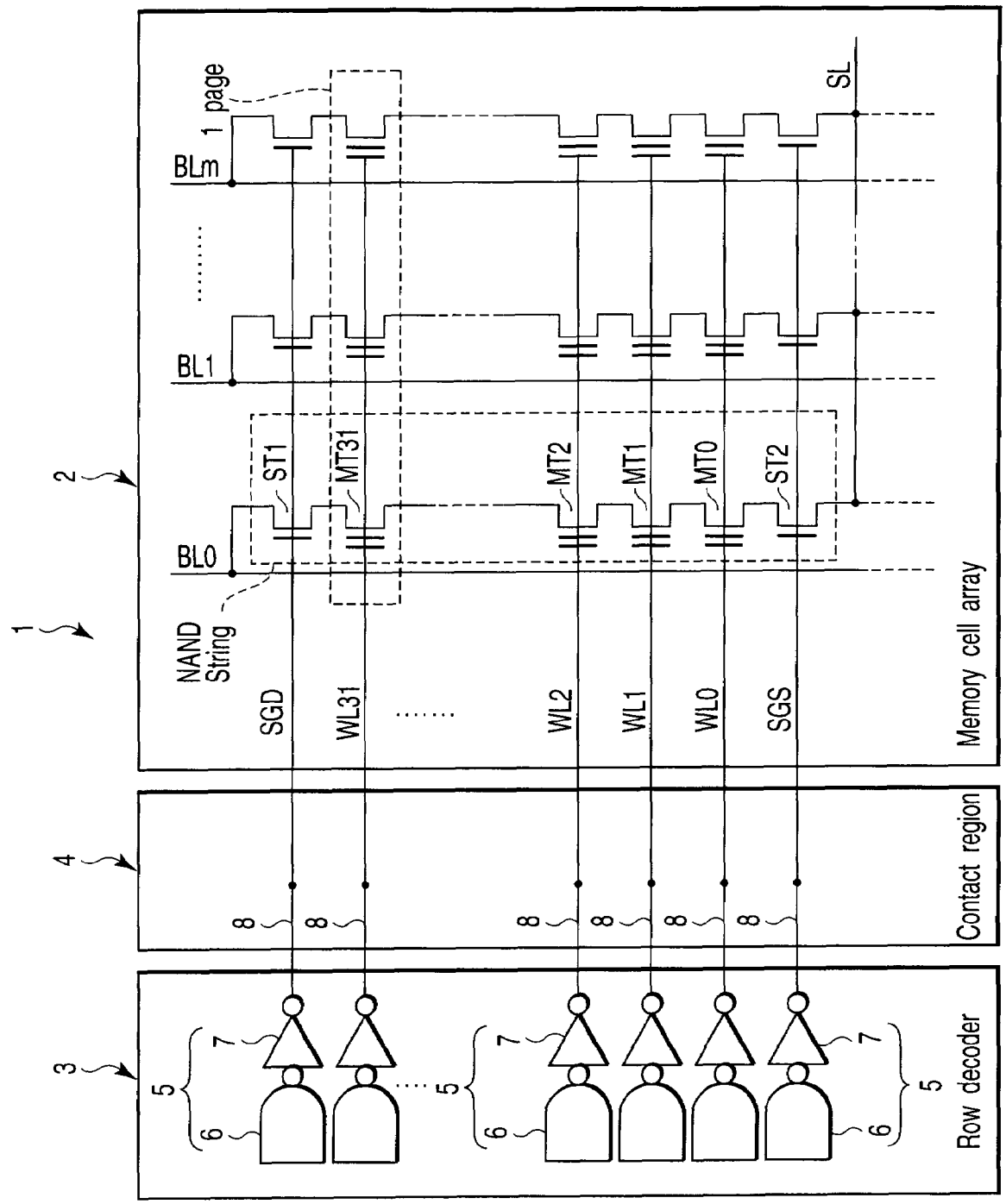
FIG. 1 is a circuit diagram showing a memory cell array, a row decoder, and a contact region which are included in a flash memory according to a first embodiment of the invention.

A semiconductor memory device according to a first embodiment of the present invention will be described with reference to FIG. 1. FIG. 1 is a block diagram showing a configuration of a NAND type flash memory according to the first embodiment.

As shown in FIG. 1, a NAND type flash memory 1 includes a memory cell array 2, a row decoder 3, and a contact region 4. First a configuration of the memory cell array 2 will be described.

As shown in FIG. 1, the memory cell array 2 includes plural NAND strings. Only one-row NAND string is shown in FIG. 1. Each NAND string includes 32 memory cell transistors MT0 to MT31 and select transistors ST1 and ST2. For the sake of simplicity, hereinafter, sometimes all the memory cell transistors MT0 to MT31 are simply referred to as memory cell transistor MT unless the memory cell transistors MT0 to MT31 are distinguished from one another. The memory cell transistor MT has a stacked gate structure includes a charge accumulation layer (for example, floating gate) and a control gate electrode. The charge accumulation layer is formed on a semiconductor substrate with a gate insulating film interposed therebetween. The control gate electrode is formed on the floating gate with an inter-gate insulating film interposed therebetween. The number of memory cell transistors MT is not limited to 32, and may be 8, 16, 64, 128, 256, etc. and there is no limitation to the number of memory cell transistors MT. A source and a drain are shared by the adjacent memory cell transistors MT. The memory cell transistors MT are arranged between the select transistors ST1 and ST2 such that current paths of the memory cell transistors MT are connected in series. A drain region on one end of the series-connected memory cell transistors MT is connected to a source region of the select transistor ST1, and a source region on the other end side is connected to a drain region of the select transistor ST2.

Control gate electrodes of the memory cell transistors MT located in the same row are commonly connected to any of word lines WL0 to WL31, and gates of the select transistors ST1 and ST2 located in the same row are commonly connected to select gate lines SGD and SGS. Drains of the select transistor ST1 located in the same column in the memory cell array are commonly connected to any of bit lines BL0 to BLm (m is a natural number). The bit line acts as a transfer line for data read from the memory cell transistor MT and data to be written in the memory cell transistor MT. For the sake of simple explanation, hereinafter, sometimes the word lines WL0 to WL31 and the bit lines BL0 to BLm are simply referred to as word line WL and bit line BL, unless the word lines WL0 to WL31 and the bit lines BL0 to BLm are distinguished from one another respectively. Sources of the select transistors ST2 are commonly connected to the source line SL. Both the select transistors ST1 and ST2 are not always required, and either of the select transistors ST1 and ST2 may be provided when the NAND string can be selected.

Although only one-row NAND string is shown in FIG. 1, plural-row NAND strings are arranged in the memory cell array 2, and the NAND strings located in the same column are connected to the same bit line BL. The data is collectively written in the plural memory cell transistors MT connected to the same word line WL, and this unit is referred to as one page. The data is collectively erased in the plural NAND strings, and this unit is referred to as block.

The row decoder 3 includes a decode circuit 5 provided in each word line WL and select gate lines SGD, SGS. Each decode circuit 5 includes a NAND gate 6 and an inverter 7. The NAND gate 6 performs a NAND calculation of a row address signal input from the outside, and the inverter 7 inverts the calculation result of the NAND gate 6. An output of the inverter 7 becomes a selection signal of the word line WL and select gate lines SGD and SGS, and each selection signal is output to the metal interconnection layer 8. That is, the row decoder 3 performs an operation of selecting the word line WL and select gate lines SGD and SGS, and the row decoder 3 applies a voltage to the word line WL and select gate lines SGD and SGS.

The contact region 4 is provided in a region located between the memory cell array 2 and the row decoder 3. In the contact region 4, each of the metal interconnection layers 8 is connected to the corresponding word line WL or select gate lines SGD and SGS. That is, each of the metal interconnection layers 8 transfers the voltage output from the row decoder 8 to the word line WL and select gate lines SGD and SGS.

Figure 2:
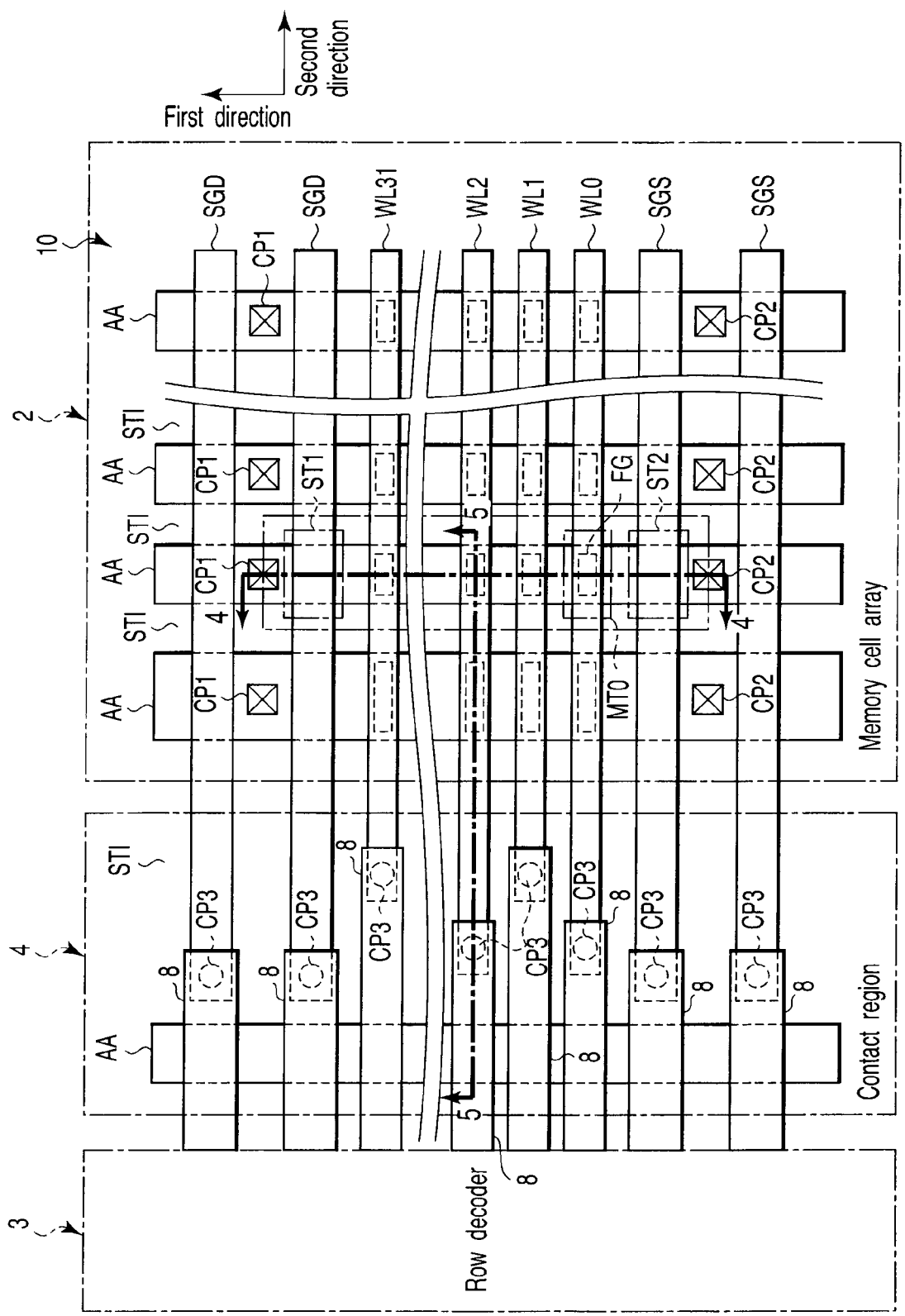
FIG. 2 is a plan view showing the memory cell array, row decoder, and contact region which are included in the flash memory according to the first embodiment.

Next, planar configurations of the memory cell array 2 and contact region 4 will be described with reference to FIG. 2. FIG. 2 is a plan view showing the memory cell array 2 and contact region 4. Firstly, the memory cell array 2 will be described.

As shown in FIG. 2, plural strip-shaped element regions AA formed along a first direction are provided along a second direction orthogonal to the first direction in a semiconductor substrate 10. An element insulating region STI is formed between the adjacent element regions AA, and the element regions AA are electrically separated from each other by the element insulating region STI. On the semiconductor substrate 10, the strip-shaped word line WL and select gate lines SGD and SGS are formed in the second direction so as to cross the plural element regions AA. A floating gate FG is provided in a region where the word line WL and the element region AA intersect each other. The memory cell transistor MT is provided in the region where the word line WL and the element region AA intersect each other, and the select transistors ST1 and ST2 are respectively provided in regions where the select gate lines SGD and SGS and the element region AA intersect each other. In the first direction, impurity diffusion layers forming the source regions or drain regions of the memory cell transistor MT and select transistors ST1 and ST2 are formed in the element region AA between the adjacent word lines WL, between the select gate lines, and between the word line and the select gate line.

The impurity diffusion layer formed in the element region AA between the adjacent select gate lines SGD in the first direction acts as the drain region of the select transistor ST1. A contact plug CP1 is formed on the drain region of the select transistor ST1. The contact plug CP1 is connected to the strip-shaped bit line BL (not shown) provided in the first direction. The impurity diffusion layer formed in the element region AA between the adjacent select gate lines SGS in the first direction acts as the source region of the select transistor ST2. A contact plug CP2 is formed on the source region of the select transistor ST2. The contact plug CP2 is connected to the source line (not shown).

In the memory cell array 2, a width of the element region AA closest to the contact region 4 is larger than that of other element regions AA. The NAND string formed in the element region AA closest to the contact region 4 may be used as a dummy.

The planar configuration of the contact region 4 will be described. AS shown to FIG. 2, the contact region 4 is adjacent to the memory cell array 2 in the second direction. The strip-shaped element region AA is formed in the first direction in the semiconductor substrate 10. The element region AA acts as a dummy element region, and no semiconductor element is formed in the element region AA. The element insulating region STI is formed in other regions of the contact region 4. Terminal portions on one-end sides of the word line WL and select gate lines SGD and SGS are drawn into the contact region 4. In the element insulating region STI of the contact region 4, contact plugs CP3 are formed on the word line WL and select gate lines SGD and SGS. Metal interconnection layers 8 which transfer the selection signal from the row decoder 3 are also drawn into the contact region 4. In the contact region 4, the metal interconnection layers 8 are connected to the word line WL and select gate lines SGD and SGS through the contact plugs CP3.

A detailed shape of the word line WL in the contact region 4 will be described with reference to FIG. 3. FIG. 3 is a plan view showing the memory cell array 2 and contact region 4, and particularly FIG. 3 shows the planar configuration of the word lines WL0 to WL31. In FIG. 3, the shaded regions indicate the word lines WL.

As shown in FIG. 3, in the contact region 4, the word lines WL are formed such that the terminal portions are located in a zigzag manner in the first direction on one end of the word line WL. In other words, when a first axis is assumed in the first direction in the contact region 4, the terminal portions are located so as to sandwich the first axis of every other line on one end of the word lines WL0 to WL31. That is, in the example shown in FIG. 3, the terminal portions on one end of the word lines WL0, WL2, WL4, WL6, . . . , and WL30 (i.e., even word line) are located on the side of the row decoder 3 relative to the first axis. On the other hand, the terminal portions on one end of the word lines WL1, WL3, WL5, WL7, . . . , and WL31 (i.e., odd word line) are located on the side of the memory cell array 2 relative to the first axis. Naturally, the arrangement of the even word lines and odd word lines may be inverted. That is, the terminal portions on one end of the even word lines may be located on the side of the memory cell array 2 relative to the first axis while the terminal portions on one end of the odd word lines are located on the side of the row decoder 3 relative to the first axis.

In other words, distances to the terminal portions on one end of the word lines WL0 to WL31 from the element region AA closest to the contact region 4 in the memory cell array 2 alternately differ from one another. In the example of FIG. 3, D1 is a distance to the terminal portions on one end of the word lines WL0, WL2, WL4, WL6, . . . , and WL30 (i.e., even word line) from the element region AA closest to the contact region 4 in the memory cell array 2. On the other hand, D2 is a distance to the terminal portions on one end of the word lines WL1, WL3, WL5, WL7, . . . , and WL31 (i.e., odd word line), and the distance D2 is smaller than the distance D1. Naturally, the relationship between the even word lines and the odd word lines may be inverted.

The contact plugs CP3 are formed on the terminal portions of the word lines WL0 to WL31 in the contact region 4. Accordingly, when an axis (the first axis in FIG. 3) is assumed in the first direction, the contact plugs CP3 are also located so as to sandwich the axis of every other line. That is, the distances to the contact plugs CP3 from the element region AA closest to the contact region 4 in the memory cell array 2 alternately differ from one another. In other words, the contact plugs CP3 are arranged in a zigzag manner in the first direction.

A width of the word line WL is processed so as to have the minimum processing dimension F in photolithography, and an interval between the adjacent word lines WL is also set to the minimum processing dimension F. For the sake of convenience, the contact plug CP3 is described smaller than the width of the word line WL in FIG. 3. However, a diameter of the contact plug CP3 is formed by the minimum processing dimension F in all the drawings unless otherwise specified. On the other hand, widths of the select gate lines SGD and SGS are formed larger than that of the word line WL. The distances between the word line WL and the select gate lines SGD and SGS are made equal to or larger than the distance between the adjacent word lines WL.

Figure 4:
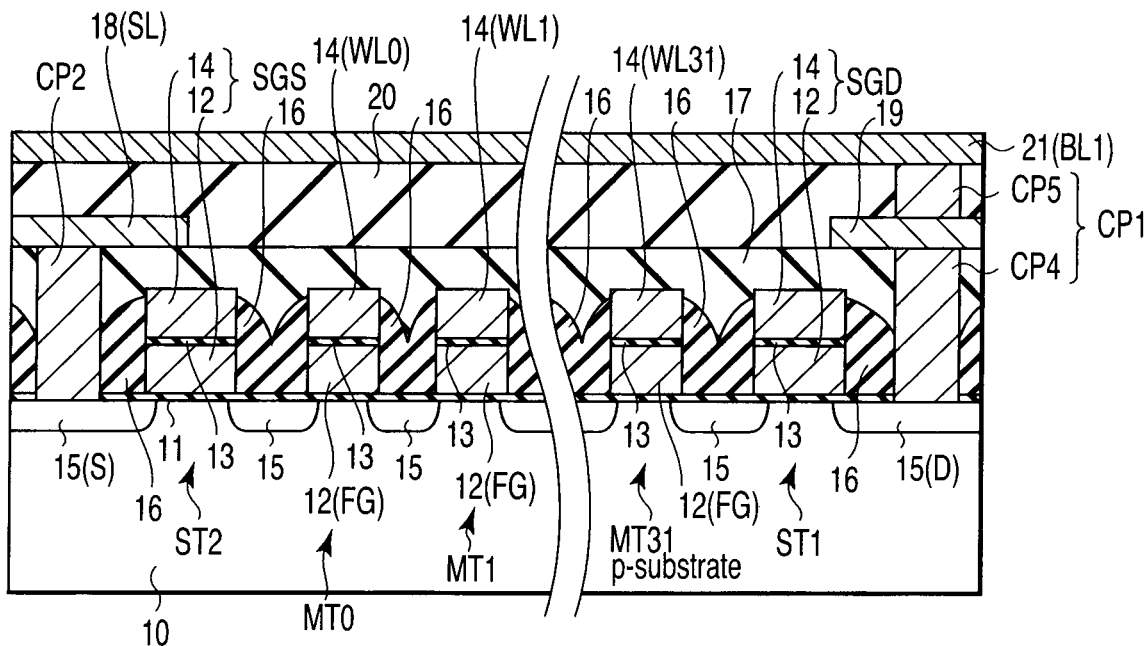
FIG. 4 is a sectional view taken along a line 4-4 of FIG. 2.
Figure 5:
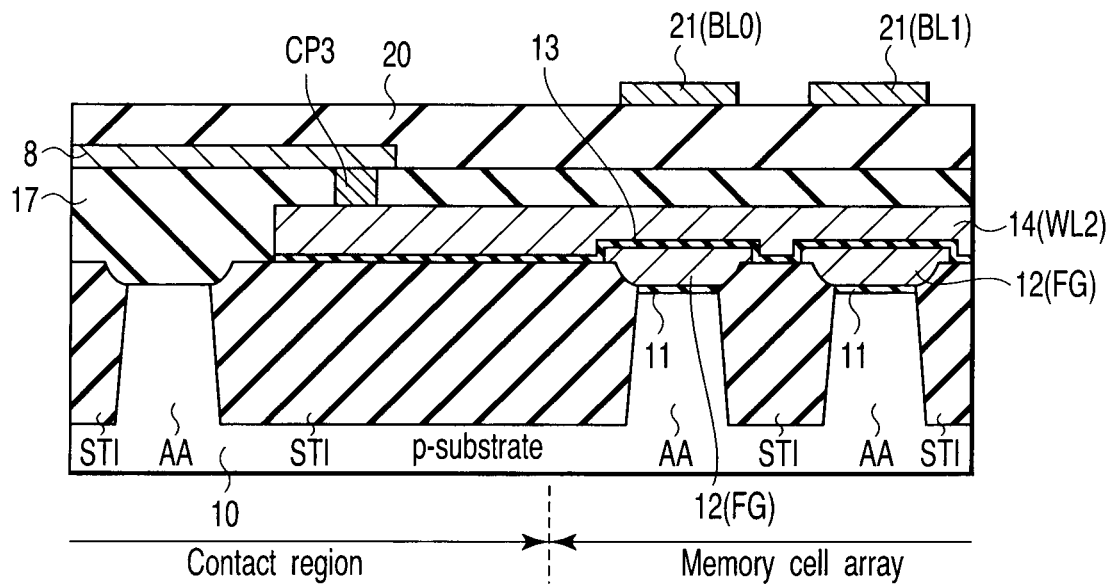
FIG. 5 is a sectional view taken along a line 5-5 of FIG. 2.

Next, a sectional configuration of the NAND string will be described with reference to FIGS. 4 and 5. FIG. 4 is a sectional view along a bit line direction of the NAND string and the contact region 4, and FIG. 4 is the sectional view taken along a line 4-4 of FIG. 2. FIG. 5 is a sectional view along a word line direction of the NAND string, and is a sectional view taken along a line 5-5 of FIG. 2.

As shown in FIGS. 4 and 5, a gate insulating film 11 is formed on the p-type semiconductor substrate 10, and the gate electrodes of the memory cell transistor MT (MT0 to MT31, hereinafter, simply referred to as MT unless MT0 to MT31 are distinguished from one another) and the gate electrodes of the select transistors ST1 and ST2 are formed on the gate insulating film 11. Each of the gate electrodes of the memory cell transistor MT and select transistors ST1 and ST2 includes a polycrystalline silicon layer 12 formed on the gate insulating film 11, an inter-gate insulating film 13 formed on the polycrystalline silicon layer 12, and a polycrystalline silicon layer 14 formed on the inter-gate insulating film 13. The inter-gate insulating film 13 is formed by a silicon oxide film, or an ON film, an NO film, and an ONO film having a stacked structure of the silicon oxide film and a silicon nitride film, or a stacked structure thereof, or a stacked structure including a $TiO_2$ film, a $HfO_2$ film, an $Al_2O_3$ film, a $HfAlO_x$ film, or a HfAlSi film and the silicon oxide film or silicon nitride film.

As shown in FIG. 5, in the memory cell transistor MT, the polycrystalline silicon layer 12 is separated in each memory cell transistor MT, and the polycrystalline silicon layer 12 acts as the floating gate (FG). On the other hand, the polycrystalline silicon layers 14 adjacent in the direction orthogonal to the bit line are commonly connected, and the polycrystalline silicon layer 14 acts as the control gate electrode (word lines WL0 to WL31, hereinafter, simply referred to as word line WL unless the word lines WL0 to WL31 are distinguished from one another). At least a part of the inter-gate insulating film 13 is removed (not shown) in the polycrystalline silicon layers 12 and 14 of the select transistors ST1 and ST2, and the polycrystalline silicon layers 12 and 14 adjacent in the word line direction are commonly connected. The polycrystalline silicon layers 12 and 14 act as the select gate lines SGS and SGD. However, only the polycrystalline silicon layer 12 need act as the select gate line. In this case, the polycrystalline silicon layers 14 of the select transistors ST1 and ST2 are set to a predetermined potential or a floating state.

An $n^+$-type impurity diffusion layer 15 is formed in a surface of the semiconductor substrate 10 located between the gate electrodes. The impurity diffusion layer 15 is shared by the adjacent transistors, and the impurity diffusion layer 15 acts as the source (S) or drain (D). A region between the adjacent source and drain acts as a channel region forming an electron moving region. A MOS transistor functioning as the memory cell transistor MT and select transistors ST1 and ST2 is formed by the gate electrode, the impurity diffusion layer 15, and the channel region.

A sidewall insulating film 16 is formed on a sidewall of the above gate electrode. A space between the gate electrodes of the adjacent memory cell transistors MT, and a space between the gate electrodes of the adjacent memory cell transistor MT and select transistors ST1 and ST2 are filled with the sidewall insulating film 16. An interlayer dielectric film 17 is formed on the semiconductor substrate 10 such that the memory cell transistor MT and the select transistors ST1 and ST2 are covered therewith. In the interlayer dielectric film 17, the contact plug CP2 is formed so as to reach the impurity diffusion layer (source) 15 of the select transistor ST2 on the source side. A metal interconnection layer 18 connected to the contact plug CP2 is formed on the interlayer dielectric film 17. The metal interconnection layer 18 acts as the source line SL. In the interlayer dielectric film 17, a contact plug CP4 is formed so as to reach the impurity diffusion layer (drain) 15 of the select transistor ST1 on the drain side. A metal interconnection layer 19 connected to the contact plug CP4 is formed on the interlayer dielectric film 17. An interlayer dielectric film 20 is formed on the interlayer dielectric film 17 such that the metal interconnection layers 18 and 19 are covered therewith. In the interlayer dielectric film 20, a contact plug CP5 is formed so as to reach the metal interconnection layer 19. A metal interconnection layer 21 commonly connected to the plural contact plugs CP5 is formed on the interlayer dielectric film 20. The metal interconnection layer 21 acts as the bit line BL, and the contact plugs CP4 and CP5 correspond to the contact plug CP1 of FIG. 2.

A sectional configuration of the contact region 4 will be described with reference to FIG. 5. As shown in FIG. 5, the element insulating region STI is formed in the semiconductor substrate 10. The polycrystalline silicon layer 14 functioning as the word line WL (FIG. 5 shows a section in the direction of the word line WL2 by way of example) and select gate lines SGD and SGS is drawn into the contact region 4. The element region AA as a dummy element region is formed in the semiconductor substrate 10. The element region AA is provided so as to be located on the side of the row decoder 3 relative to the terminal portion on one end of the polycrystalline silicon layer 14. The interlayer dielectric film 17 is formed on the semiconductor substrate 10. The contact plug CP3 is formed in the interlayer dielectric film 17 so as to reach the surface of the polycrystalline silicon layer 14. Naturally, not the element region AA but the element insulating region STI is formed in the semiconductor substrate 10 immediately below the contact plug CP3. The metal interconnection layer 8 connected to the contact plug CP3 is formed on the interlayer dielectric film 17. The metal interconnection layer 8 is connected to each decode circuit 5 in the row decoder 3.

Figure 7:
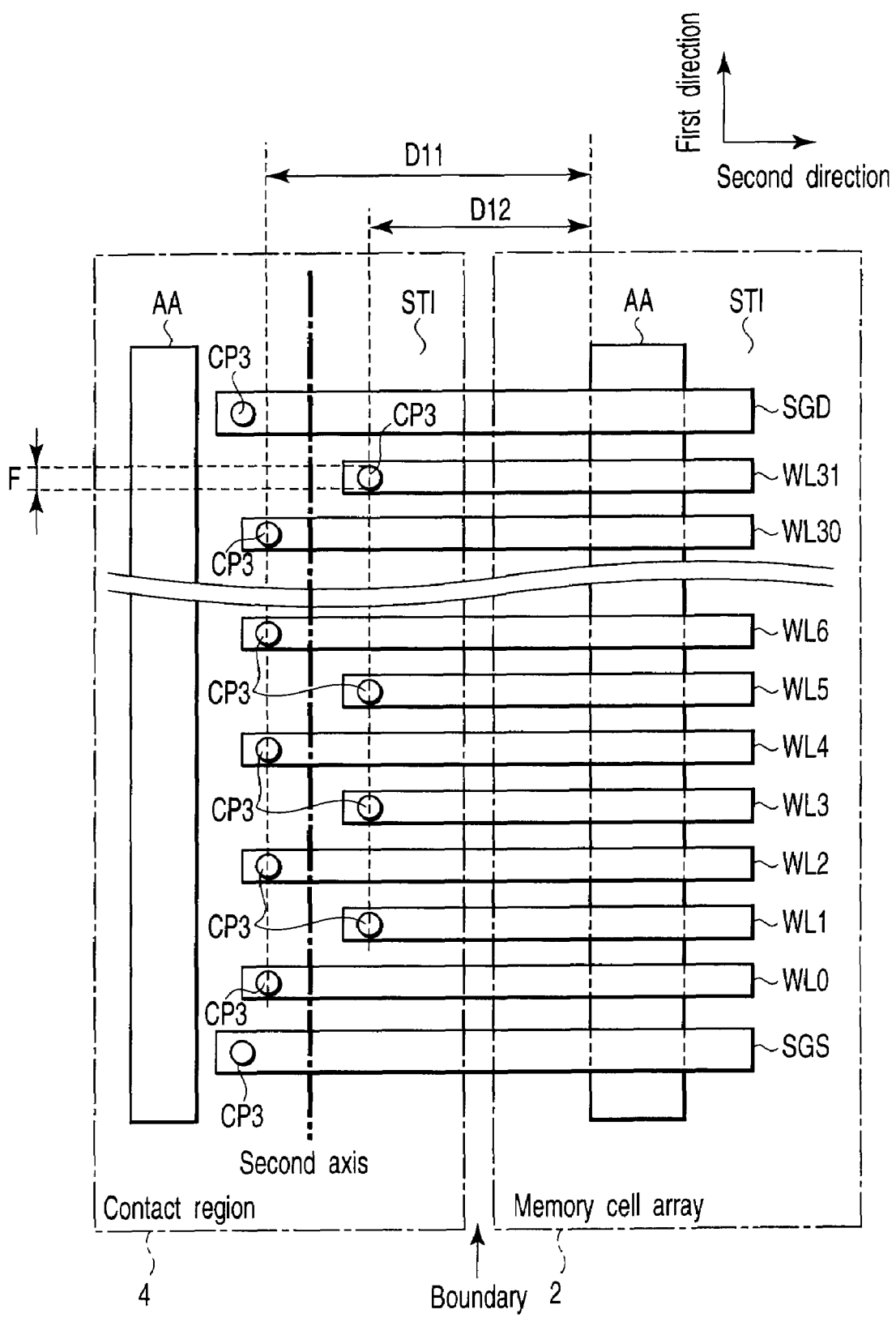
Figure 8:
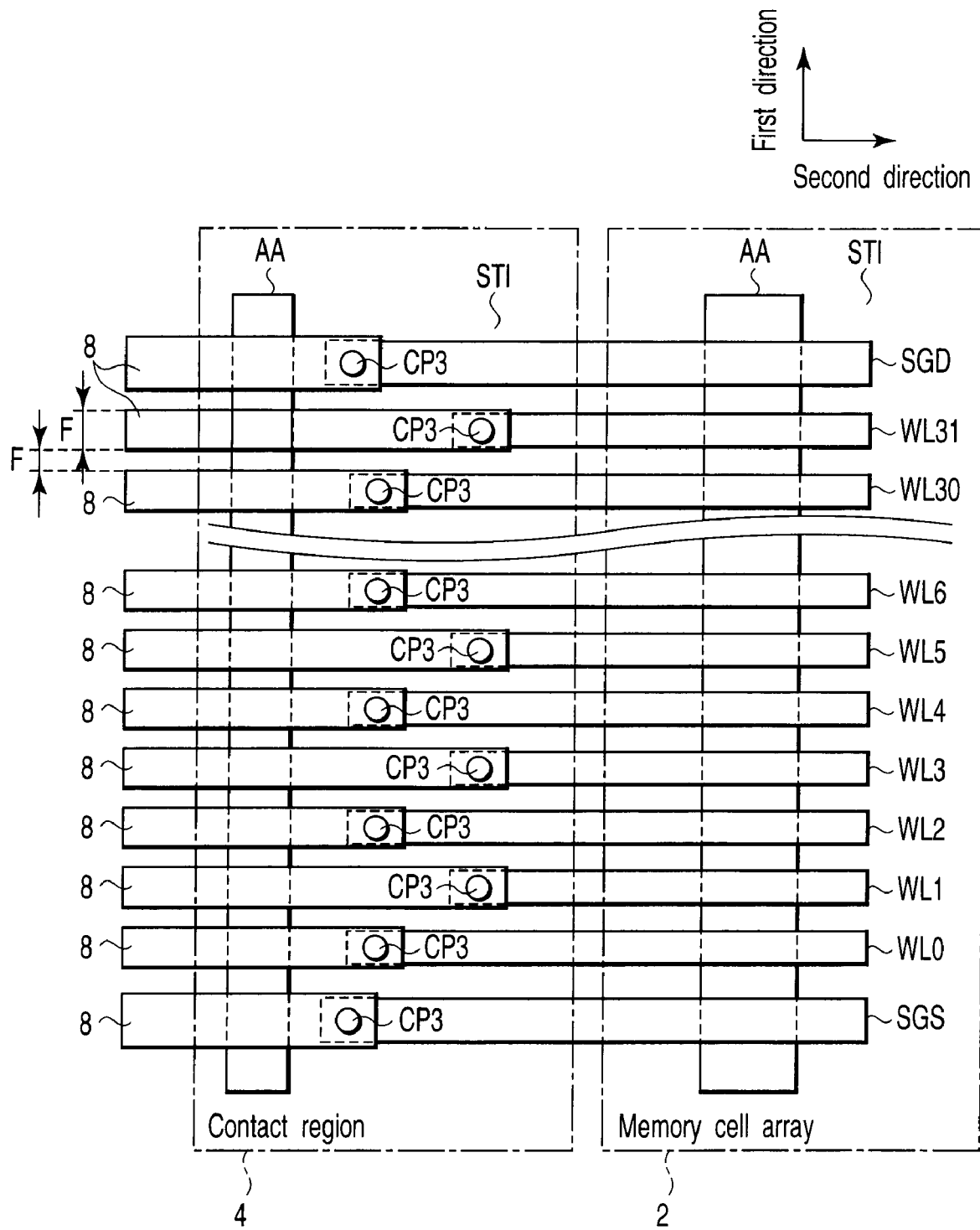

Next, a method of producing the NAND type flash memory, in particular the contact region 4 will be described with reference to FIGS. 6 to 8. FIGS. 6 to 8 are plan views sequentially showing processes of producing the memory cell array 2 and contact region 4, and FIGS. 6 to 8 correspond to the region shown in FIG. 3.

The gate insulating film 11 and the polycrystalline silicon layer 12 are sequentially formed on the semiconductor substrate 10 according to the conventional method of producing the NAND type flash memory. After the polycrystalline silicon layer 12 is deposited, the polycrystalline silicon layer 12, the gate insulating film 11, and the semiconductor substrate 10 are etched to form a trench using a photolithography technique and anisotropic etching such as RIE (Reactive Ion Etching). The trench is used to form the element insulating region. At this point, the trench for the dummy element insulating region STI is also formed in the contact region 4. Then the trench is filled with the insulating film to complete the element insulating region STI. Then, the inter-gate insulating film 13 and the polycrystalline silicon layer 14 are sequentially formed on the polycrystalline silicon layer 12 and the element insulating region STI.

Then, the polycrystalline silicon layers 14 and 12 and the inter-gate insulating film 13 are etched using the photolithography technique and RIE. As a result, the word lines WL and the select gate lines SGD and SGS are formed as shown in FIG. 6. At this point, the width of the word line WL and the interval between the adjacent word lines WL are processed in the minimum processing dimension F of photolithography. The terminal portions on one end of the word lines WL are processed so as to be located on the element insulating region STI in the contact region 4 and to be alternately located closer to the row decoder 3 and the memory cell array 2 with sandwiching the first axis. In other words, word lines WL are processed such that the distance to the terminal portion on one end of the word line WL from the end portion of the element region AA located closest to the contact region 4 in the memory cell array 2 alternately becomes D1 and D2. Accordingly, the distance from a boundary position between the memory cell array 2 and the contact region 4 to the terminal portion on one end of the word line WL is also changed every other line.

Then, for example, phosphorous, arsenic, or antimony is ion-implanted into the surface of the semiconductor substrate 10. At this point, the polycrystalline silicon layers 12 and 14 act as a mask for the ion implantation. As a result, as shown in the figure, the n$^+$-type impurity diffusion layer 15, which acts as the source region and drain region, is formed in the surface of the semiconductor substrate 10.

Then, the insulating film is formed on the semiconductor substrate 10, and the insulating film is partially etched using RIE so as to remain only at the sidewall portion of the gate electrode. Therefore, the sidewall insulating film 16 is completed.

Then, the interlayer dielectric film 17 is formed on the semiconductor substrate 10 by an LPCVD method or the like. The interlayer dielectric film 17 is formed by the silicon oxide film which is formed by, e.g., TEOS (Tetraethylorthosihcate), HTO (High Temperature Oxidation), BSG (Boron Silicate Glass), PSG (Phosphorous Silicate Glass), BPSG (Boron Phosphorous Silicate Glass), or HDP (High Density Plasma), or silicon nitride film.

As shown in FIG. 7, in the contact region 4, the contact plug CP3 is formed in the interlayer dielectric film 17 so as to reach the word line WL and select gate lines SGD and SGS. The contact plug CP3 is formed such that the diameter of the contact plug CP3 becomes the minimum processing dimension F of photolithography. In the contact plugs CP3 arrayed in the first direction, the contact plugs CP3 connected to the word lines WL are formed so as to be alternately located close to the row decoder and the memory cell array with sandwiching the second axis in the first direction in the contact region 4. In other words, the contact plugs CP3 are formed such that the distance to each contact plug CP3 from the end portion of the element region AA located closest to the contact region 4 in the memory cell array 2 alternately becomes D11 and D12 (<D11). Accordingly, the distance from the boundary position between the memory cell array 2 and the contact region 4 to the terminal portion on one end of the word line WL is also changed every other line. In the process, the contact plugs CP2 and CP4 may be simultaneously formed using the same mask. The first axis and the second axis may be identical to each other.

As shown in FIG. 8, the metal interconnection layer 8 connected to the contact plug CP3 is formed on the interlayer dielectric film 17. The metal interconnection layer 8 is connected to each decode circuit 5 of the row decoder 3. At this point, the metal interconnection layer 8 is formed such that the line width of the metal interconnection layer 8 becomes the minimum processing dimension F of photolithography (although FIG. 8 shows that the line width of the metal interconnection layer 8 is described larger than the line width of the word line WL for the sake of easy understanding, the line width of the metal interconnection layer 8 is the minimum processing dimension F). Accordingly, the intervals between the adjacent metal interconnection layers 8 which are connected to the word lines WL become the minimum processing dimension F. At this point, the metal interconnection layer 18 functioning as the source line SL and the metal interconnection layer 19 connected to the contact plug CP4 are simultaneously formed.

Then, the interlayer dielectric film 20 is formed on the interlayer dielectric film 17, and the contact plug CP5 and the metal interconnection layer 21 are formed to complete the NAND type flash memory.

Thus, the following effects (1) and (2) are obtained in the semiconductor memory device according to the first embodiment.

(1) A chip area can be reduced in the NAND type flash memory.

As described in the background art, in the NAND type flash memory, the micro-fabrication technique is significantly developed in recent years. The adjacent word lines WL are formed such that the line width of the word line WL and the interval between the adjacent word lines WL become the minimum processing dimension F of photolithography. Therefore, the contact plugs CP3 which should be formed on the word line WL are hardly arranged on a line in the first direction in consideration of the short circuit between the adjacent contact plugs CP3 and the misalignment with the word line.

Therefore, in the conventional NAND type flash memory, as disclosed in JP-A No. 2002-151601, the lengths of the word lines are sequentially increased in the first direction to shift the contact plug positions in the second direction. However, in the configuration disclosed in JP-A No. 2002-151601, the area of the contact region is increased as the number of word lines included in one NAND string is increased, which results in the problem in that the chip area is increased.

On the other hand, in the configuration of the first embodiment of the present invention, as shown in FIGS. 3 and 6 to 8, the lengths of the word lines WL in the contact region 4 are alternately changed in the order of the word lines WL0 to WL31. That is, the terminal position on one end of the word line WL is changed in a zigzag manner in the first direction. Accordingly, the width can be largely reduced in the second direction of the contact region 4 compared with the conventional technique. For example, when 64 word lines exist in one NAND string, the width in the second direction of the contact region 4 can be reduced to about ½₀ compared with the configuration disclosed in JP-A No. 2002-151601. This is because the lengths of the 64 word lines differ from one another in the configuration disclosed in JP-A No. 2002-151601 while only two kinds of lengths are required in the configuration of the first embodiment.

As a result, the chip area can be reduced in the NAND type flash memory. The contact plugs CP3 are arranged in a zigzag manner, which allows the contact plug CP3 to be formed in the minimum processing dimension F while also considering the misalignment with the word line WL. The contact plug CP3 can be formed in the same process using the same mask as the contact plugs CP2 and/or CP4 is used, and the production process can be shortened.

Further, the short-circuit between the adjacent contact plugs CP3 is prevented because the position related to the second direction of the contact plug CP3 connected to the select gate line SGD, SGS is shifted from that of the contact plug CP3 connected to the word line WL adjacent to the select gate line SGD, SGS.

(2) Processing accuracy of the word line can be improved.

Desirably not the element region AA but the element insulating region STI is formed in the region immediately below the contact plug CP3. This is because the insulation between the word line WL and the element region AA must be considered when the element region AA is formed in the region immediately below the contact plug CP3. That is, stress is applied to the word line and the gate insulating film in the process of forming the contact plug CP3, which possibly degrades the withstand voltage of the gate insulating film. Therefore, desirably the element insulating region STI exists immediately below the contact plug CP3.

In the conventional configuration, because the contact region 4 has a large area, the element insulating region STI also gave a large area in the contact region, which causes planarization to be hardly performed in the surface of the element insulating region STI in the contact region. Specifically, the element insulating region STI has a mortar-shaped surface whose central portion is recessed. This is because the surface of the element insulating region STI is subject to the planarization process such as a CMP (Chemical Mechanical Polishing) process. Therefore, because the element insulating region STI is also the region which is an underlying layer of the word line WL, the abnormal shape causes the accuracy to be decreased in the photolithography process of the word line WL.

Figure 9:
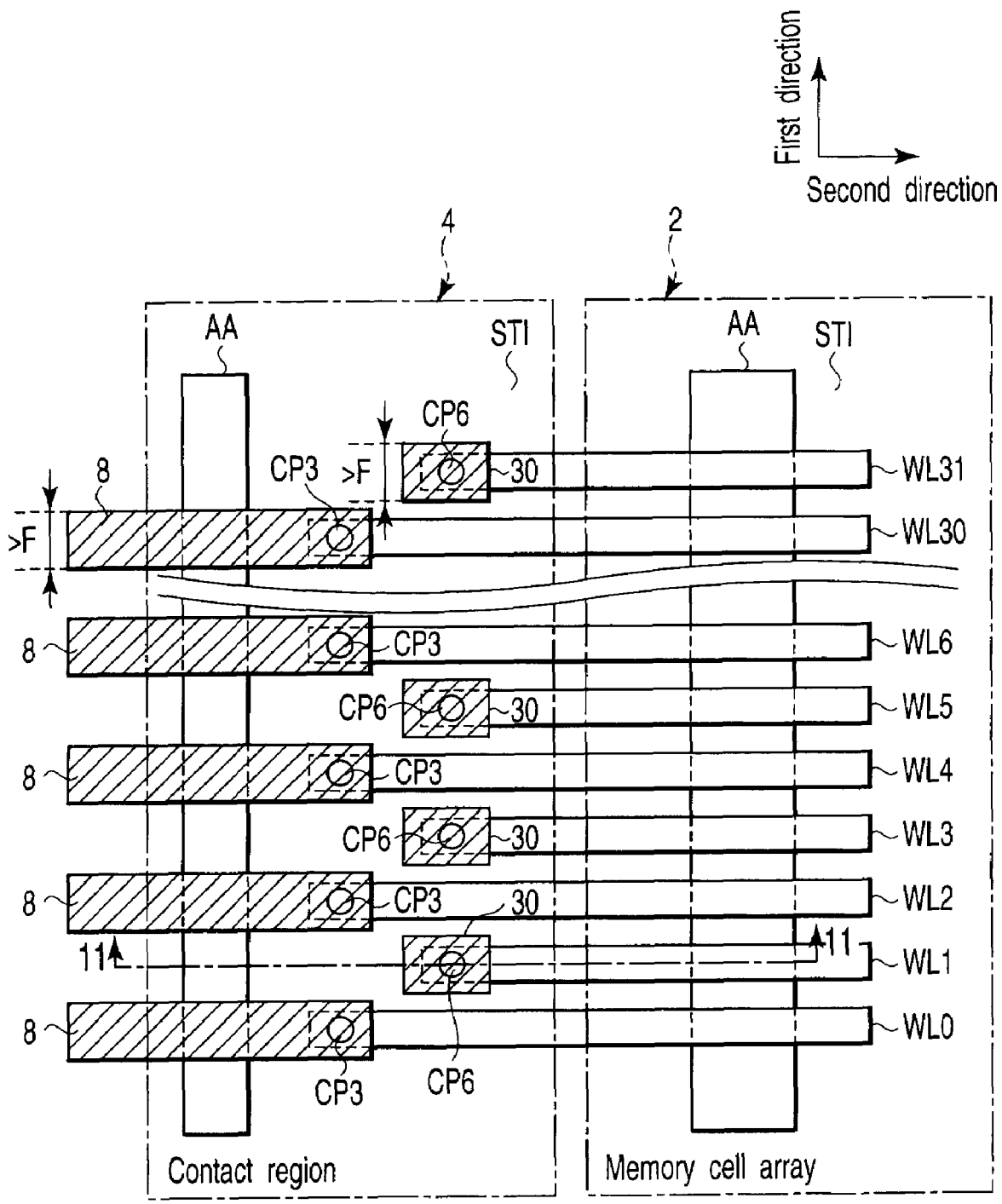
FIGS. 9 and 10 are plan views showing a memory cell array and a contact region which are included in a flash memory according to a modification of the first embodiment, and show first and second metal interconnection layers respectively.
Figure 10:
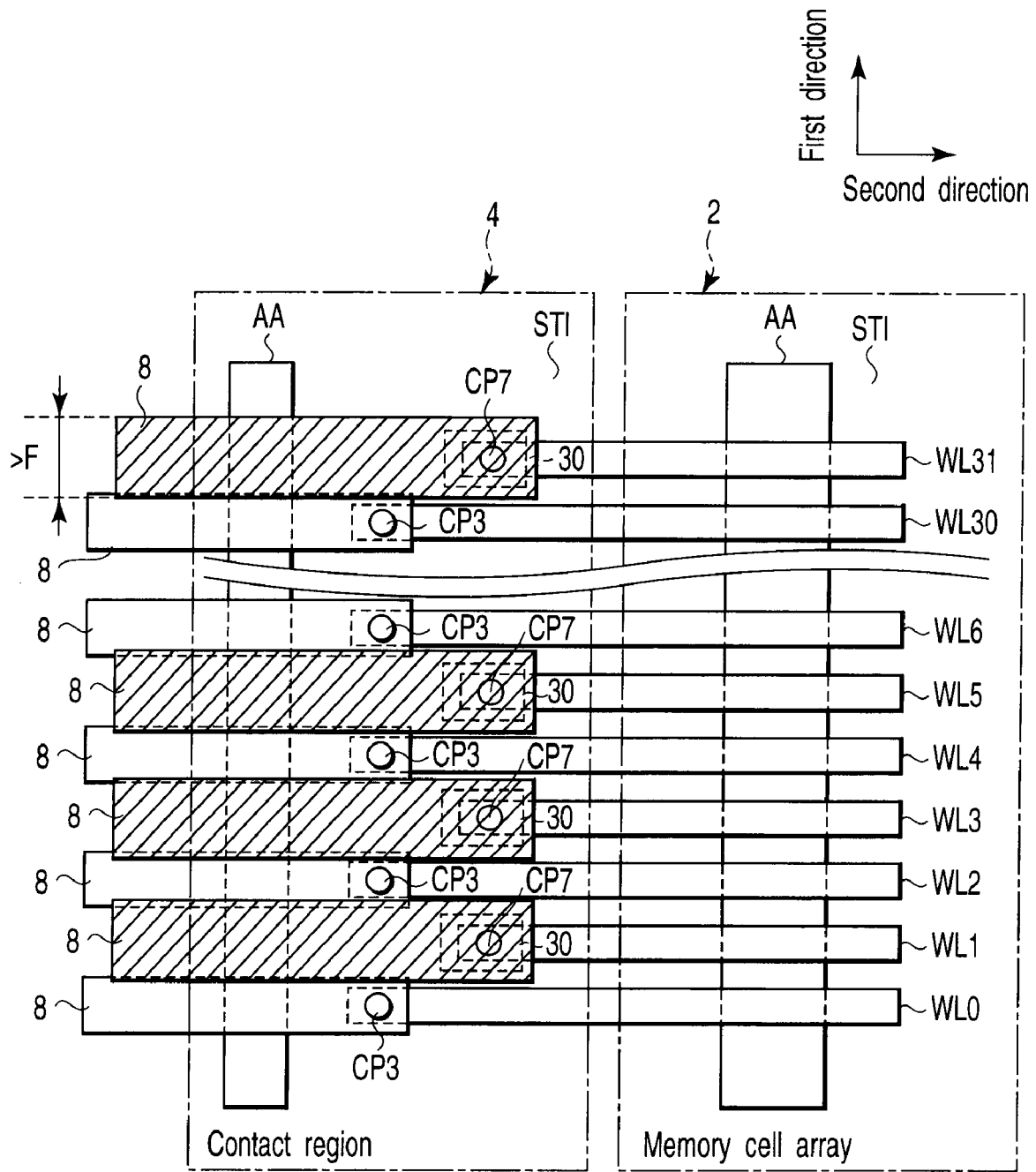
Figure 11:
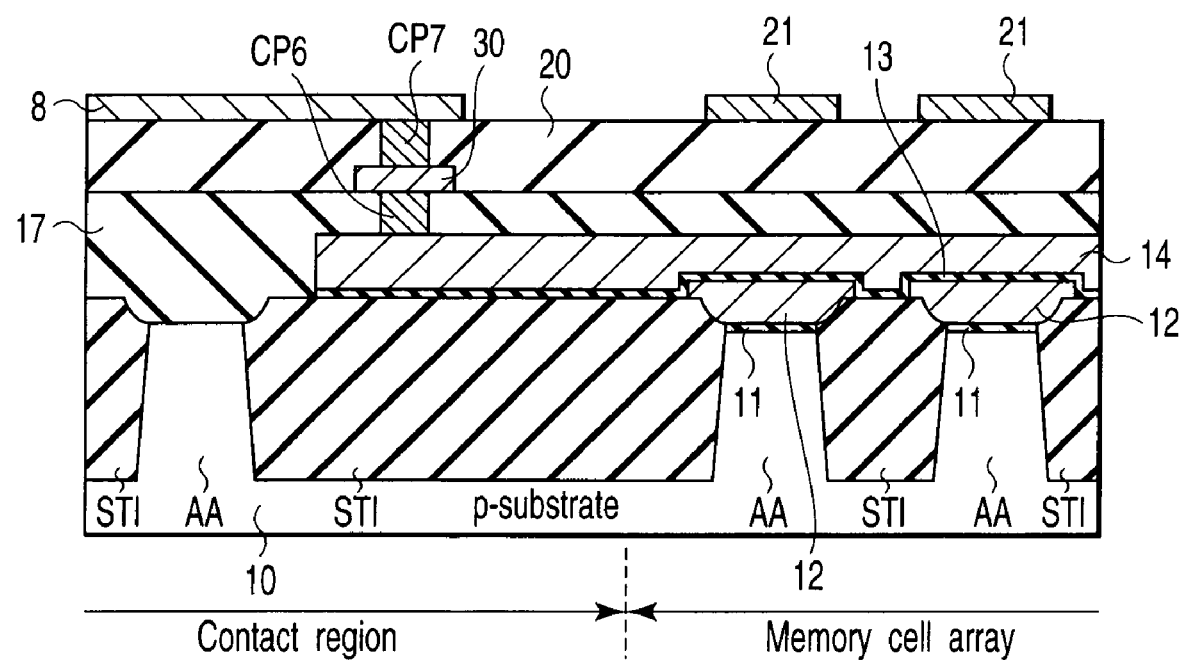
FIG. 11 is a sectional view taken along a line 11-11 of FIG. 9.

On the other hand, however, in the configuration of the first embodiment, as described in the effect (1), the area of the contact region 4 is reduced, and the area of the element insulating region STI can also be reduced in the contact region 4, which allows the planarization to be improved in the surface of the element insulating region STI. Therefore, the processing accuracy can be improved in the word line and select gate line which are drawn onto the element insulating region STI and the contact plug CP3 which is formed so as to contact with the word line and select gate line In the first embodiment, all the metal interconnection layers 8 are formed at the same level. However, the metal interconnection layers 8 connected to the word lines WL may be formed at different levels every other line. In this case, the configuration will be described with reference to FIGS. 9 to 11. FIGS. 9 and 10 are plan views showing a memory cell array and a contact region of a NAND type flash memory according to a modification of the first embodiment. FIG. 9 shows a first metal interconnection layer at a first level above the surface of the semiconductor substrate, and FIG. 10 shows a second metal interconnection layer at a second level above the first level. FIG. 11 is a sectional view taken along a line 11-11 of FIG. 9.

As shown in FIGS. 9 to 11, the metal interconnection layers 8 connected to the even word lines (word lines WL0, WL2, WL4, WL6, . . . , and WL30) are formed by a first metal interconnection layer formed on the interlayer dielectric film 17. On the other hand, the contact plugs CP6 are formed on the odd word lines (word lines WL1, WL3, WL5, WL7, . . . , and WL31), and a metal interconnection layer 30 is formed on the interlayer dielectric film 17 so as to be connected to the contact plug CP6.

A contact plug CP7 is further formed on the metal interconnection layer 30, and the metal interconnection layer 8 is formed on the interlayer dielectric film 20 so as to be connected to the contact plug CP7. That is, the metal interconnection layers 8 connected to the word lines are formed at different levels every other line. Because the interval between the adjacent metal interconnection layers 8 can be increased at each level, the line width of the metal interconnection layer 8 can be formed larger than the minimum processing dimension F. In this case, the line width of the metal interconnection layer 8 is larger than the line width of the word line WL.

Second Embodiment

Figure 12:
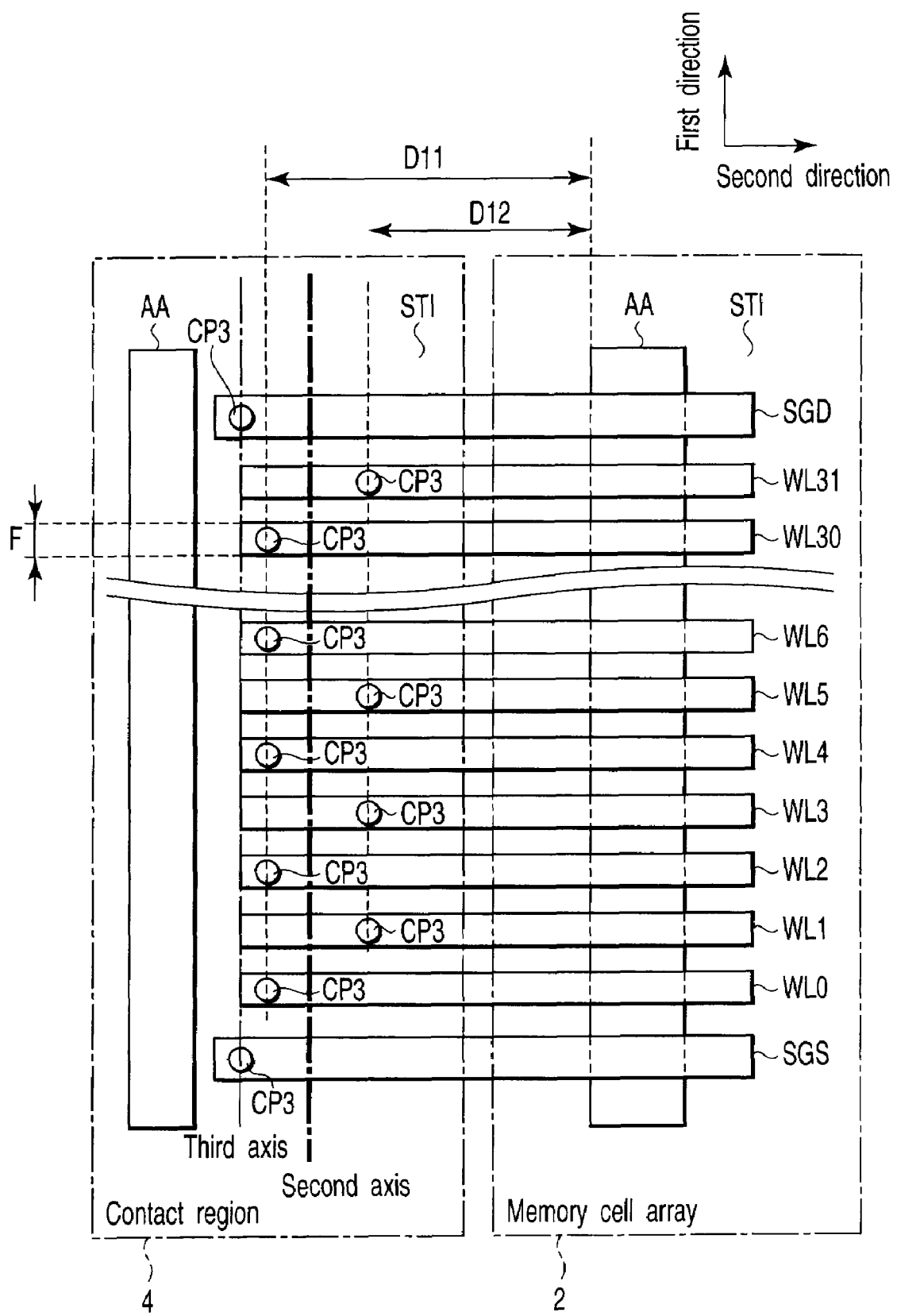
FIG. 12 is a plan view showing a memory cell array and a contact region which are included in a flash memory according to a second embodiment of the invention.

A semiconductor memory device according to a second embodiment of the invention will be described below. In the second embodiment, lengths of word lines WL0 to WL31 of the first embodiment are made equal to one another. FIG. 12 is a plan view showing the memory cell array 2 and contact region 4 in a NAND type flash memory according to the second embodiment, and particularly FIG. 12 shows a planar configuration of the word line WL (word lines WL0 to WL31, hereinafter, simply referred to as word line WL unless the word lines WL0 to WL31 are distinguished from one another).

As shown in FIG. 12, in the contact region 4, all the word lines belonging to the same NAND string are made to have the same length. In other words, when a third axis is assumed in the first direction in the contact region 4, the terminal portions on one end of the word lines WL0 to WL31 are located on the third axis. In other words, the distance from the terminal portion to the end portion of the element region AA closest to the contact region 4 in the memory cell array 2 is equal for all the word lines. Similarly to the first embodiment, the contact plugs CP3 are formed so as to be located in a zigzag manner in the first direction. That is, the contact plugs CP3 are located so as to sandwich the second axis in the first direction. In the example of FIG. 12, D11 is the distance to the contact plug CP3 formed on even word line from the end portion of the element region AA closest to the contact region 4 in the memory cell array 2, and D12 (<D11) is the distance to the contact plug CP3 formed on the odd word line.

The width of the word line WL, the interval between the adjacent word lines, and the diameter of the contact plug CP3 are formed so as to have the minimum processing dimension of photolithography. The metal interconnection layer 8 (not shown) is formed so as to be connected to each contact plug CP3. Because other configurations are similar to those of the first embodiment, the description is omitted.

Figure 14:
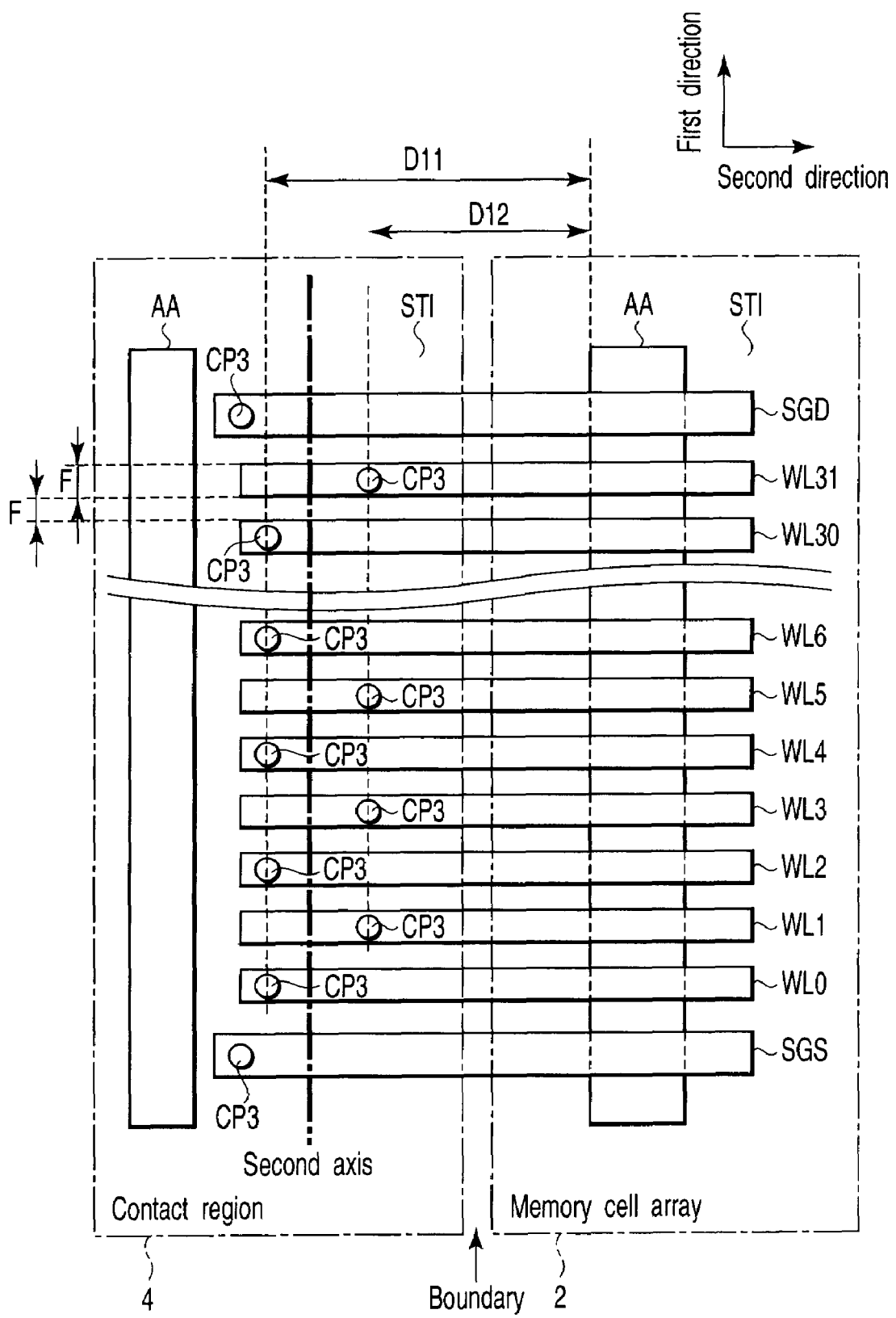
Figure 15:
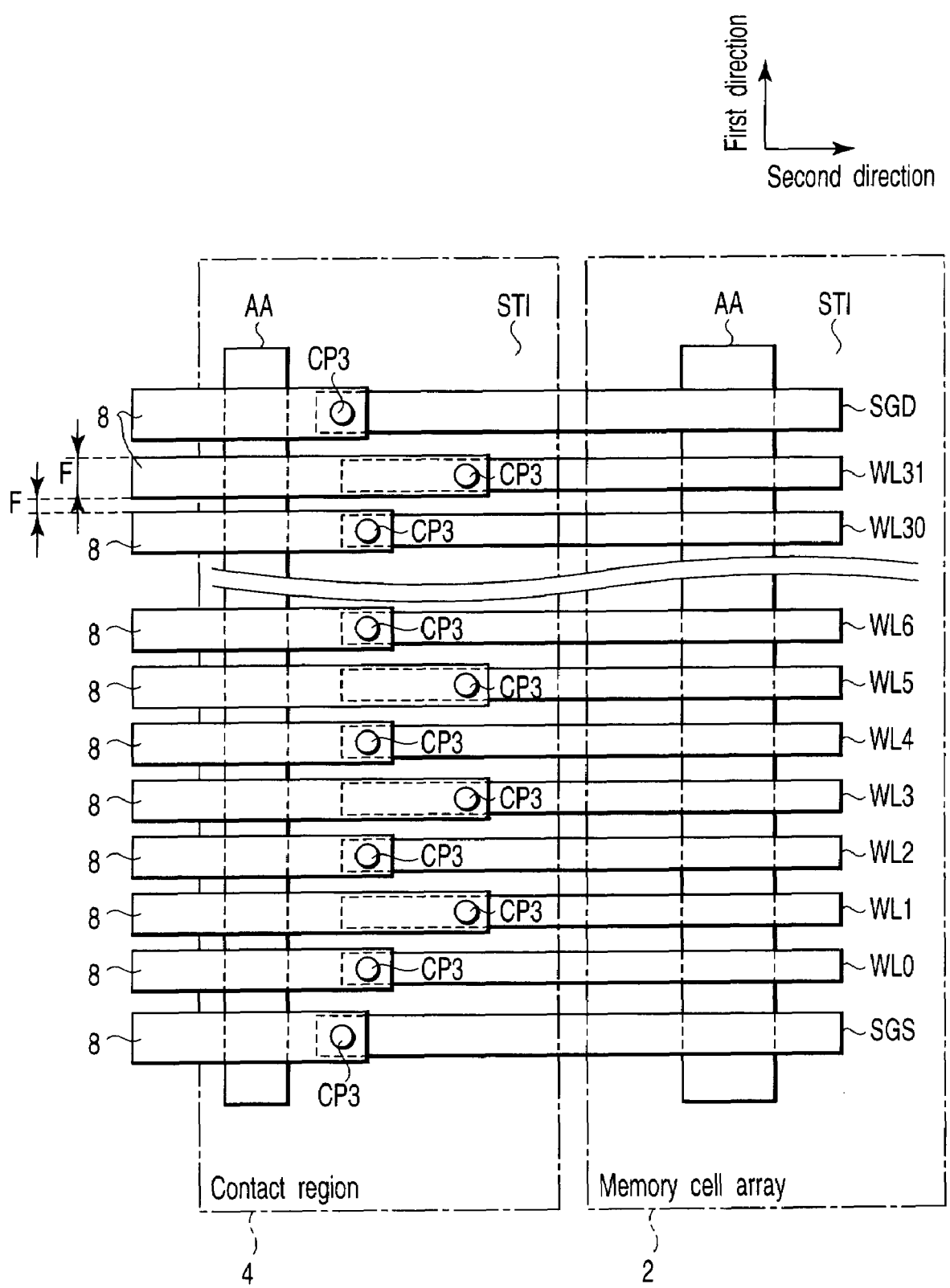

A method of producing the NAND type flash memory, in particular the contact region 4 will be described with reference to FIGS. 13 to 15. FIGS. 13 to 15 are sectional views sequentially showing processes of producing the memory cell array 2 and contact region 4, and FIGS. 13 to 15 correspond to the region shown in FIG. 12. Only the points different from the first embodiment will be described below.

According to the production method described in the first embodiment, the element insulating region STI is formed, and the inter-gate insulating film 13 and the polycrystalline silicon layer 14 are sequentially formed. Then, the polycrystalline silicon layers 14 and 12 and the inter-gate insulating film 13 are etched using the photolithography technique and RIE. As a result, as shown in FIG. 13, the word line WL and the select gate lines SGD and SGS are formed. At this point, the width of the word line WL and the interval between the adjacent word lines WL are formed in the minimum processing dimension F of photolithography. The word lines WL are formed such that terminal portion on one end of the word line WL is located on the element insulating region STI and such that the terminal portions of all the word lines WL are located on the third axis. In other words, the word lines have the same distance D3 from the end portion of the element region AA closest to the contact region 4 in the memory cell array 2 to the terminal portion on one end of the word line WL. Accordingly, the distance from the boundary position between the memory cell array 2 and the contact region 4 to the terminal portion on one end of the word line WL becomes equal for all the word lines WL.

Then, the impurity diffusion layer 15, the sidewall insulating film 16, and the interlayer dielectric film 17 are formed. As shown in FIG. 14, in the contact region 4, the contact plug CP3 is formed in the interlayer dielectric film 17 so as to reach the word line WL and select gate lines SGD and SGS. The contact plug CP3 is formed such that the diameter of the contact plug CP3 becomes the minimum processing dimension F of photolithography. In the contact plugs CP3 arrayed in the first direction, the contact plug CP3 connected to the word line WL is formed so as to be alternately located close to the row decoder and the memory cell array with sandwiching the second axis in the first direction in the contact region 4. In other words, the contact plugs CP3 are formed such that the distance to each contact plug CP3 from the end portion of the element region AA closest to the contact region 4 in the memory cell array 2 becomes alternately the distances D11 and D12. Accordingly, the distance from the boundary position between the memory cell array 2 and the contact region 4 to the terminal portion on one end of the word line WL is also changed every other line. The process is similar to that of FIG. 7 described in the first embodiment, and the contact plugs CP2 and CP4 may simultaneously be formed.

As shown in FIG. 15, the metal interconnection layer 8 connected to the contact plug CP3 is formed on the interlayer dielectric film 17. The process of FIG. 15 is similar to that of FIG. 8 described in the first embodiment. The metal interconnection layer 8 is formed such that the line width of the metal interconnection layer 8 becomes the minimum processing dimension F of photolithography (although FIG. 15 also shows that the line width of the metal interconnection layer 8 is described larger than the line width of the word line WL, the line width of the metal interconnection layer 8 is the minimum processing dimension F).

Thus, similarly to the first embodiment, the effects (1) and (2) are obtained in the semiconductor memory device according to the second embodiment.

In the configuration of the second embodiment, the contact plugs CP3 are arranged in a zigzag manner. Additionally, the word lines belonging to the same NAND string have the same length. That is, the word lines have the same length in the configuration of FIG. 3 described in the first embodiment, and therefore the width can be reduced in the second direction of the contact region 4 like the first embodiment.

Figure 16:
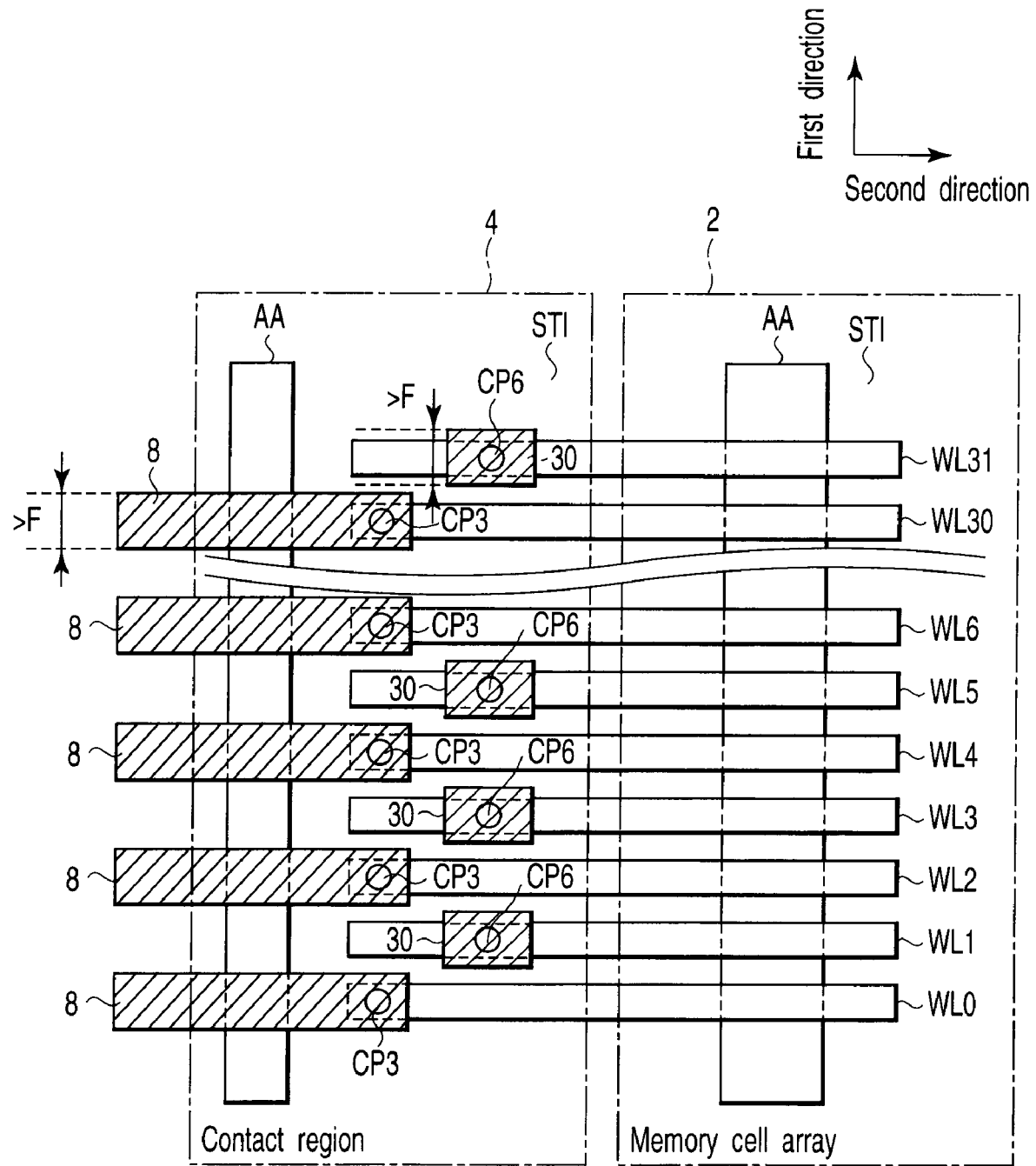
FIGS. 16 and 17 are plan views showing a memory cell array and a contact region which are included in a flash memory according to a modification of the second embodiment, and show first and second metal interconnection layers respectively.
Figure 17:
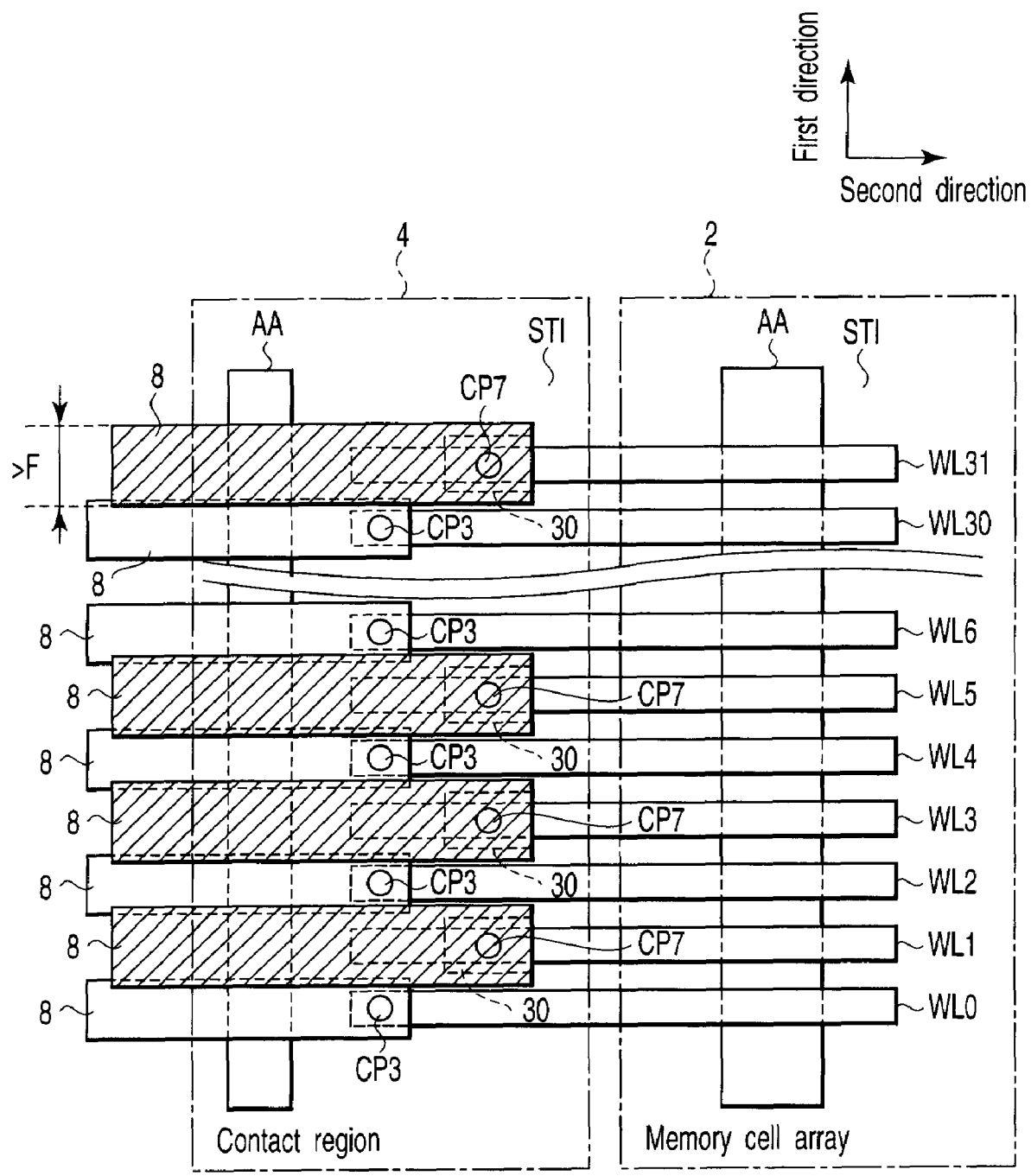

In the second embodiment, similarly to the modification of the first embodiment, the metal interconnection layers 8 connected to the word lines WL may be formed at different levels every other line. In this case, the configuration will be described with reference to FIGS. 16 to 17. FIGS. 16 and 17 are plan views showing a memory cell array and a contact region of a NAND type flash memory according to a modification of the second embodiment, FIG. 16 shows a first metal interconnection layer, and FIG. 17 shows a second metal interconnection layer.

As shown in FIGS. 16 and 17, the metal interconnection layers 8 connected to the even word lines (word lines WL0, WL2, WL4, WL6, . . . , and WL30) are formed by the first metal interconnection layer formed on the interlayer dielectric film 17. On the other hand, the metal interconnection layers 8 connected to the odd word lines (word lines WL1, WL3, WL5, WL7, and WL31) are formed by a second metal interconnection layer formed on the interlayer dielectric film 20. The odd word line and the second metal interconnection layer 8 are connected through the contact plugs CP6 and CP7 and metal interconnection layer 30. By the configuration of the second embodiment, the line width of the metal interconnection layer 8 can be formed larger than the line width of the word line WL.

Third Embodiment

Figure 18:
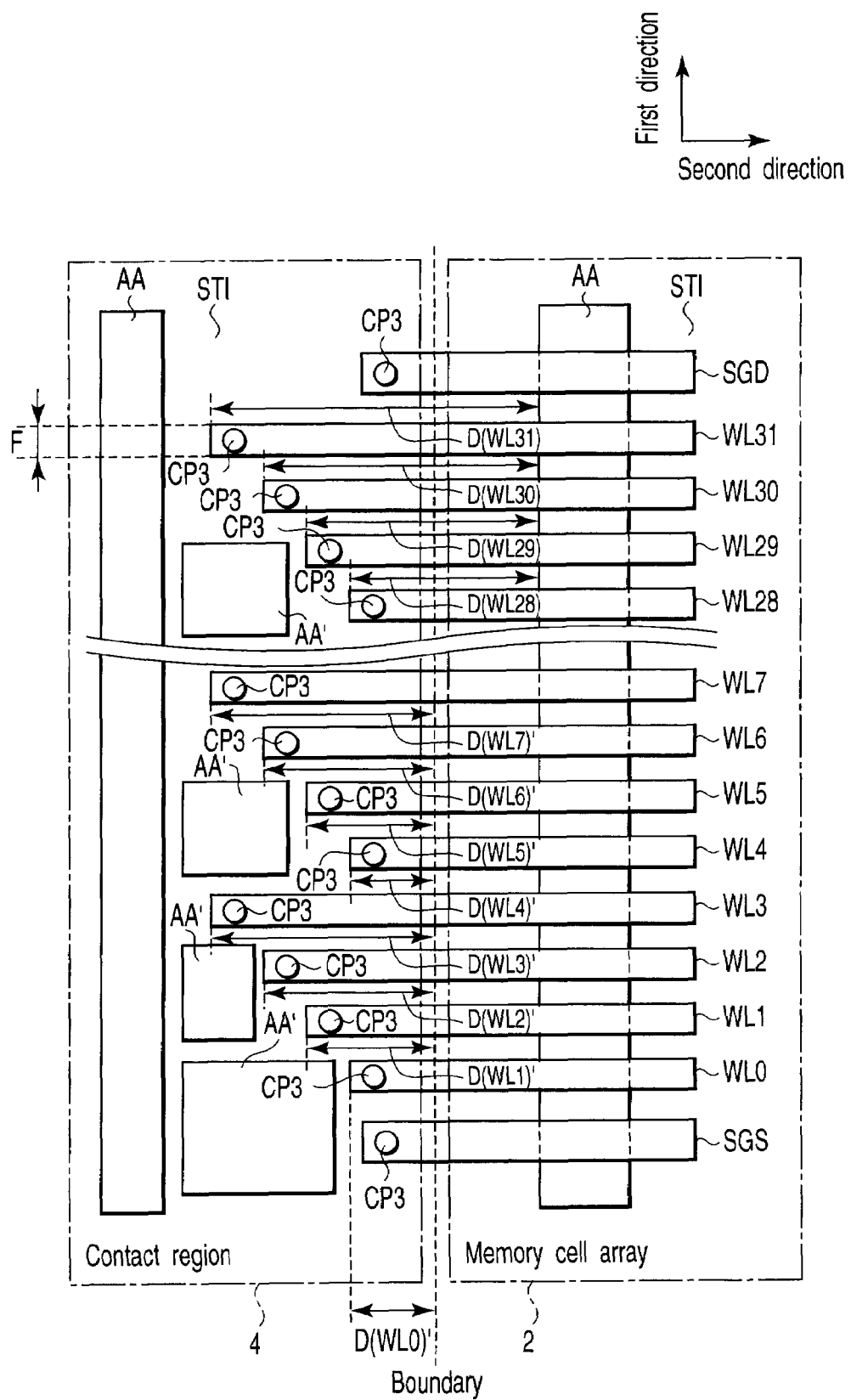
FIG. 18 is a plan view showing a memory cell array and a contact region which are included in a flash memory according to a third embodiment of the invention.

A semiconductor memory device according to a third embodiment of the invention will be described below. In the third embodiment, the length of the word line WL belonging to the same NAND string of the first embodiment is changed in the contact region 4. FIG. 18 is a plan view showing the memory cell array 2 and contact region 4 in a NAND type flash memory according of the third embodiment of the invention, and particularly FIG. 18 shows a planar configuration of the word lines WL0 to WL31 (hereinafter, simply referred to as word line WL unless the word lines WL0 to WL31 are distinguished from one another).

Hereinafter, the distances from the end portion of the element region AA closest to the contact region 4 in the memory cell array 2 to the terminal portions on one end of the word lines WL0 to WL31 are referred to as distances D(WL0) to D(WL31) respectively. The distances from the boundary between the memory cell array 2 and the contact region 4 to the terminal portions on one end of the word lines WL0 to WL31 are referred to as distances D(WL0)' to D(WL31)' respectively. However, sometimes the distances D(WL0) to D(WL31) and the distances D(WL0)' to D(WL31)' are collectively referred to as distance D(WL) and distance D(WL)' unless the distances D(WL0) to D(WL31) and the distances D(WL0)' to D(WL31)' are distinguished from one another. In FIG. 18, because of space limitation, only the distances D(WL28) to D(WL31) and the distances D(WL0)' to D(WL7)' are shown by way of example.

One group is formed by each four word lines WL close to one another. That is, each of the word lines WL0 to WL3, WL4 to WL7, WL8 to WL11, ..., and WL28 to WL31 has one group. As shown in FIG. 18, the distances D(WL) and D(WL)' for the word lines WL included in each group is increased in the order from the word line WL close to the select gate line SGS to the word line WL close to select gate line SGD.

Accordingly, for example, the distances D(WL0)<D(WL1)<D(WL2)<D(WL3) and the distance D(WL4)<D(WL5)<D(WL6)<D(WL7). Similarly, for example, the distances D(WL0)'<D(WL1)'<D(WL2)'<D(WL3)' and the distances D(WL4)'<D(WL5)'<D(WL6)'<D(WL7)'.

That is, the word line WL (for example, the word line WL4: D(WL4)) which is adjacent to the word line WL (for example, the word line WL3: D(WL3)) having the largest distances D(WL) and D(WL)' in one group (for example, the group of the word lines WL0 to WL3) and belongs to another group becomes the word line having the smallest distances D(WL) and D(WL)' in the group (the group of the word lines WL4 to WL7). In other words, the minimum value of the distances D(WL4) to D(WL7) becomes the distance D(WL4), and the minimum value of the distances D(WL4)' to D(WL7)' becomes the distance D(WL4)'. The contact plug CP3 connected to the metal interconnection layer 8 (not shown) is formed at the terminal portion on each word line WL. Therefore, the distance from the contact plug CP3 to the end portion of the element region AA closest to the contact region 4 in the memory cell array 2 and the distance from the contact plug CP3 to the boundary between the memory cell array 2 and the contact region 4 also have the same relationship as the word line WL. Another dummy element region AA' is also formed in the region between the word line WL and the dummy element region AA in the contact region 4.

Figure 19:
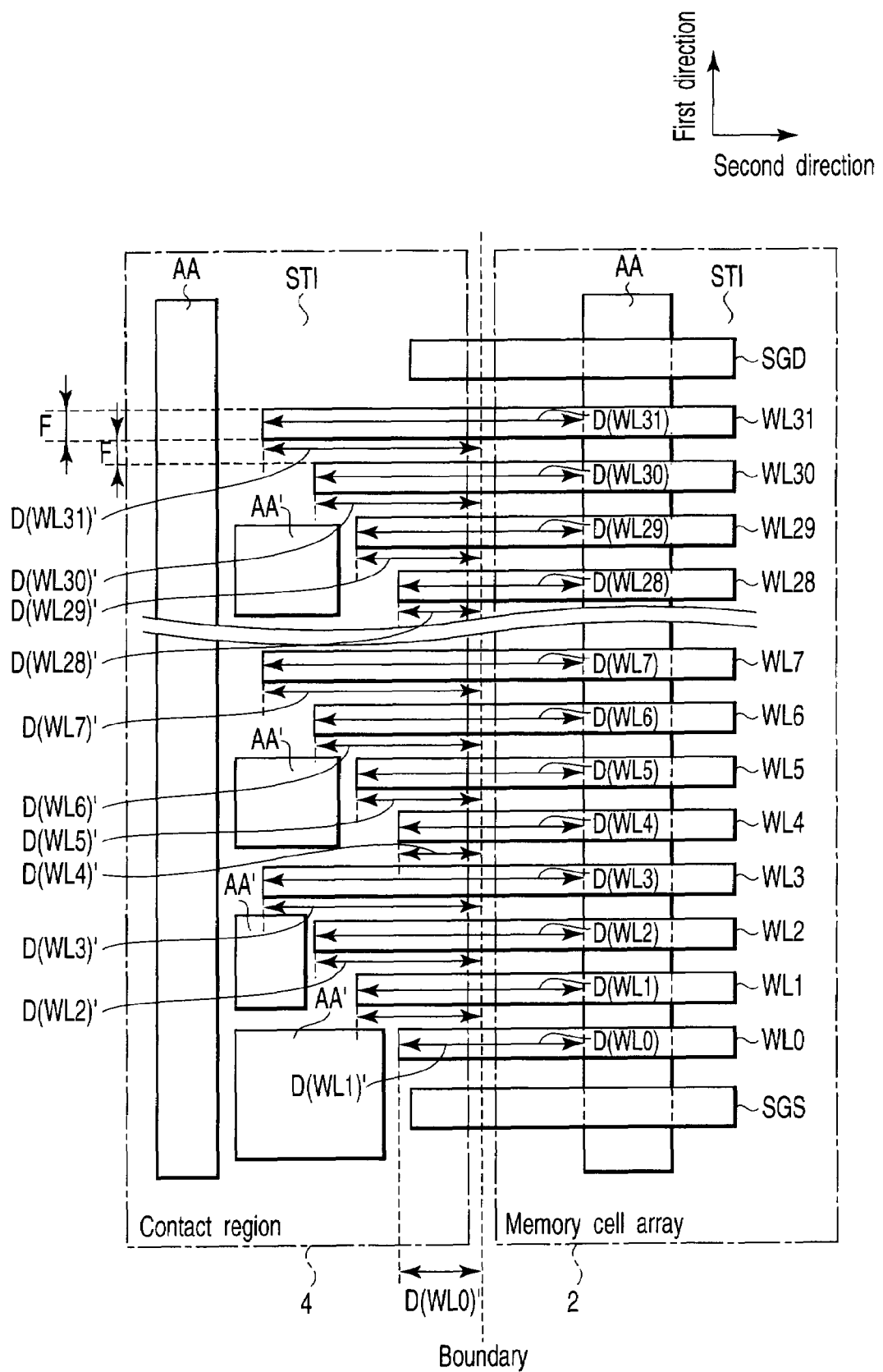
Figure 20:
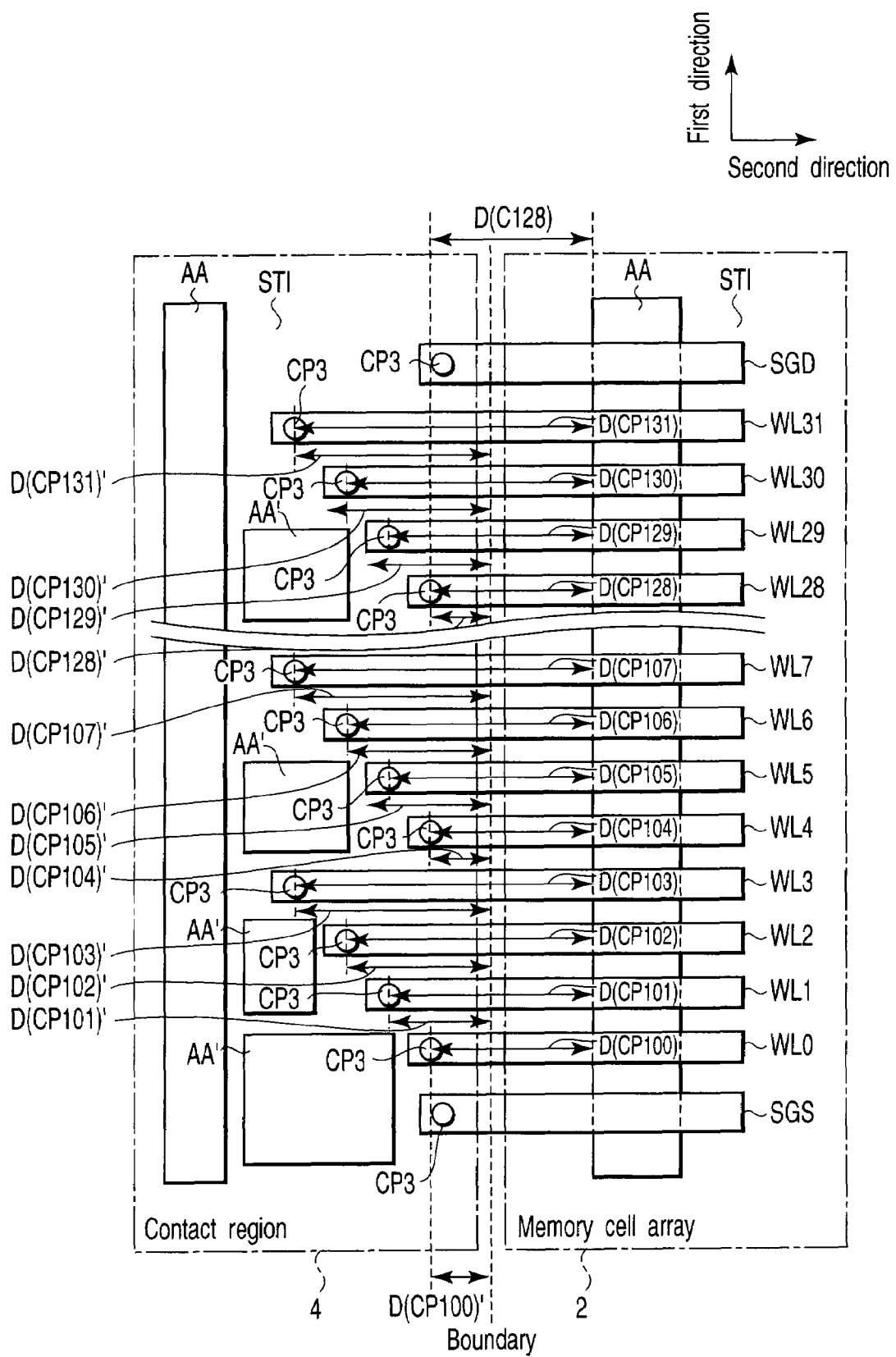

Next, a method of producing the NAND type flash memory according to the third embodiment, in particular the contact region 4 will be described with reference to FIGS. 19 to 21. FIGS. 19 to 21 are plan views sequentially showing processes of producing the memory cell array 2 and contact region 4, and FIGS. 19 to 21 correspond to the region shown in FIG. 18. Only the method of processing the word line and the method of forming the contact plug CP3 will be described below. Other methods are similar to those of the first embodiment.

As shown in FIG. 19, the polycrystalline silicon layers 14 and 12 and the inter-gate insulating film 13 are etched using the photolithography technique and RIE. As a result, the word line WL and the select gate lines SGD and SGS are formed. At this point, the width of the word line WL and the interval between the adjacent word lines WL are processed in the minimum processing dimension F of photolithography. The word lines WL are formed such that the distances D(WL) and D(WL)' for the word lines WL included in each group are lengthened in the order from the word line WL close to the select gate line SGS to the word line WL close to the select gate line SGD. As described above, the word lines WL0 to WL31 are processed such that the relationships of the distance D(WL0)<D(WL1)<D(WL2)<D(WL3), the distance D(WL4)<D(WL5)<D(WL6)<D(WL7), and the distance D(WL28)<D(WL29)<D(WL30)<D(WL31) are obtained. As described above, the word lines WL0 to WL31 are processed such that the relationships of the distance D(WL0)'<D(WL1)'<D(WL2)'<D(WL3)', the distance D(WL4)'<D(WL5)'<D(WL6)'<D(WL7)', and the distance D(WL28)'<D(WL29)'<D(WL30)'<D(WL31)' are obtained. In the above configuration, processing accuracy of the word line can be improved because the terminal portions on one end of the word lines WL are arranged in accordance with a certain periodicity.

As shown in FIG. 20, in the contact region 4, the contact plug CP3 is formed in the interlayer dielectric film 17 so as to reach the word line WL and select gate lines SGD and SGS. The contact plug CP3 is formed on the terminal portion of each of the word line WL and select gate lines SGD and SGS.

Hereinafter, the distances from the end portion of the element region AA closest to the contact region 4 in the memory cell array 2 to the contact plugs CP3 on the word lines WL0 to WL31 are referred to as distances D(CP100) to D(CP131) respectively, and the distances from the boundary between the memory cell array 2 and the contact region 4 to the contact plugs CP3 on the word lines WL0 to WL31 are referred to as distances D (CP100)' to D(CP131)' respectively. However, sometimes the distances D(CP100) to D(CP131) and the distances D(CP100)' to D(CP131)' for the contact plugs CP3 formed on the word lines WL0 to WL31 are collectively referred to as distance D(CP) and distance D(CP)' unless the distances D(CP100) to D(CP131) and the distances D(CP100)' to D(CP131)' are distinguished from one another. Then, the following relationship holds. That is, the distances D(CP) and D(CP)' for the word lines WL included in each group are lengthened in the order from the word line WL close to the select gate line SGS to the word line WL close to the select gate line SGD.

That is, the contact plugs are formed on the word lines WL0 to WL31 such that the relationships of the distance D(CP100)<D(CP101)<D(CP102)<D(CP103), the distance D(CP104)<D(CP05)<D(CP106)<D(CP107), and the distance D(CP128)<D(CP129)<D(CP130)<D(CP131) are obtained. Additionally, in other words, the contact plugs are formed on the word lines WL0 to WL31 such that the relationships of the distance D(CP100)'<D(CP101)'<D(CP102)'<D(CP103), the distance D(CP104)'<D(CP105)'<D(CP106)'<D(CP107)', and the distance D(CP128)'<D(CP129)'<D(CP130)'<D(CP131)'.

The distances D(CP) and D(CP)' (for example, D(CP104) and D(CP104)') for the word line WL (for example, the word line WL4) which is adjacent to the word line WL (for example, the word line WL3) having the largest distances D(CP) and D(CP)' in one group (for example, the group of the word lines WL0 to WL3) and belongs to another group becomes the smallest in the group (the group of the word lines WL4 to WL7). In other words, the minimum value of the distances D(CP104) to D(CP107) becomes the distance D(CP104), and the minimum value of the distances D(CP104)' to D(CP107)' becomes the distance D(CP104)'.

As shown in FIG. 21, the metal interconnection layer 8 connected to the contact plug CP3 is formed on the interlayer dielectric film 17. The process is similar to that of FIG. 8 described in the first embodiment. The metal interconnection layer 8 is formed such that the line width of the metal interconnection layer 8 becomes the minimum processing dimension F of photolithography (although FIG. 21 also shows that the line width of the metal interconnection layer 8 is larger than the line width of the word line WL, the line width of the metal interconnection layer 8 is the minimum processing dimension F).

Thus, similarly to the first embodiment, the effects (1) and (2) are obtained in the semiconductor memory device according to the third embodiment.

In the configuration of the third embodiment, the lengths on one end of the word lines included in the same NAND string are periodically changed. In the same period, the word lines are lengthened in the order in the first direction. In the next period, the lengths of the word lines are lengthened from the shortest length in the previous period in the order in the first direction again. As a result, when the terminal portions of the word lines in the same period are connected by a straight line, the straight line is inclined relative to the first direction and second direction. A sawtooth shape is obtained when the straight lines of the periods are connected. Accordingly, similarly to the first and second embodiments, the effects (1) and (2) are obtained because the width in the second direction can be reduced in the contact region 4.

Figure 22:
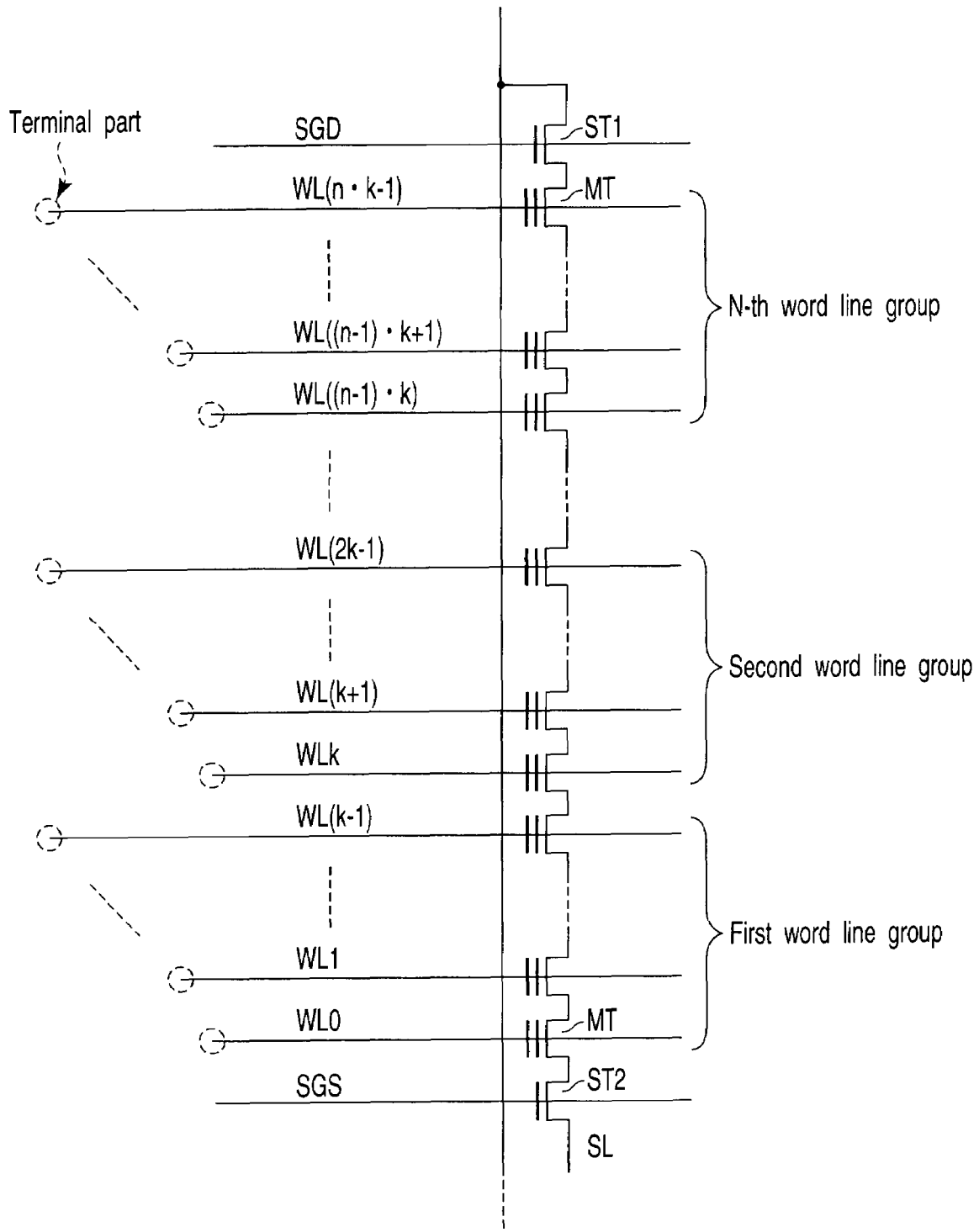
FIG. 22 is an equivalent circuit diagram showing a NAND string included in the flash memory according to the third embodiment.

In the third embodiment, the four word lines form one period and the eight periods are repeated. However, the embodiment is not limited to the third embodiment. Another configuration will be described with reference to FIG. 22. FIG. 22 is a circuit diagram showing the NAND string of the third embodiment while paying attention to the position of the terminal portion of the word line.

As shown in FIG. 22, the plural word lines WL connected to the same NAND string belong to any of a first word line group to an n-th word line group. Where n is a natural number of 2 or larger, preferably 3 or larger. The word lines belonging to the first word line group to the n-th word line group are the word lines connected to the plural memory cell transistors sequentially arrayed in the first direction in the NAND string. It is assumed that k is the number of word lines belonging to each of the first word line group to the n-th word line group (k is a natural number of 3 or larger). Accordingly, the word lines WL0 to WL(k−1) belong to the first word line group, the word lines WLk to WL(2k−1) belong to the second word line group, and the word lines WL(n−1)·k to WL(n·k−1) belong to the n-th word line group.

In the configuration of FIG. 22, in the word lines belonging to each of the first word line group to the n-th word line group, the distance D(WL)' from the terminal portion to the boundary between the memory cell array and the contact region are made larger in the order in the first direction. In other words, the distance D(WL) from the end portion of the element region AA closest to the contact region 4 in the memory cell array 2 is made larger. In other words, the length in the second direction is made larger in the contact region 4.

In the word lines belonging to the (i+1)-th word line group (i is a natural number of 1 to (n−1)), the word line adjacent to the word line having the largest distances D(WL)' and D(WL) in the i-th word line group is made to have the smallest distances D(WL)' and D(WL) in the (i+1)-th word line group. For example, in the word lines WLk to WL(2k−1) included in the second word line group, the word line WLk adjacent to the word line WLk having the largest distances D(WL)' and D(WL) in the first word line group is made to have the smallest distances D(WL)' and D(WL) in the second word line group. Thus, the number of word line groups and the number of word lines belonging to the word line group are not limited to the third embodiment.

The same relationship holds true for the distance with the contact plug CP3 formed on each word line WL. In the contact plugs CP3 formed on the word lines belonging to each of the first word line group to the n-th word line group, the distance D(CP)' to the boundary between the memory cell array 2 and the contact region 4 are made larger in the order in the first direction. In other words, the distance D(CP) to the end portion of the element region AA closest to the contact region 4 in the memory cell array 2 is increased. In the word lines belonging to the (i+1)-th word line group, the contact plug CP3 formed on the word line adjacent to the word line having the largest distances D(CP)' and D(CP) in the i-th word line group has the smallest distances D(WL)' and D(WL) in the (i+1)-th word line group.

In the third embodiment, it is sufficient that the positions of the contact plugs CP3 are changed in a sawtooth shape. Accordingly, similarly to the second embodiment, the lengths in the second direction of the word lines may be equal to one another in the contact region 4. In this case, FIG. 23 shows the configuration. FIG. 23 is a plan view showing a memory cell array and a contact region of a NAND type flash memory according to a modification of the third embodiment. In FIG. 23, only the distances D(CP28) and D(CP0)' are shown as the distances D(CP) and D(CP)', and the distances D(WL) and D(WL)' are omitted. However, the distances D(WL) and D(WL)' are defined as described above.

As shown in FIG. 23, similarly to the second embodiment, all the word lines WL belonging to the same NAND string have the same length in the contact region 4. The distances D(WL0)' to D(WL31)' are made equal to one another, and the distances D(WL0) to D(WL31) are also made equal to one another. In other words, when the third axis in the first direction is assumed in the contact region 4, all the terminal portions on one end of the word lines WL0 to WL31 are located on the third axis. With this configuration, the distances D(CP100) to D(CP131) and the distances D(CP100) to D(CP131) satisfy the conditions described in the third embodiment. Thus, the configuration of FIG. 23 can be adopted when the diameter of the contact plug CP3 and the line width of the metal interconnection layer 8 can be formed in the minimum processing dimension.

Fourth Embodiment

Figure 24:
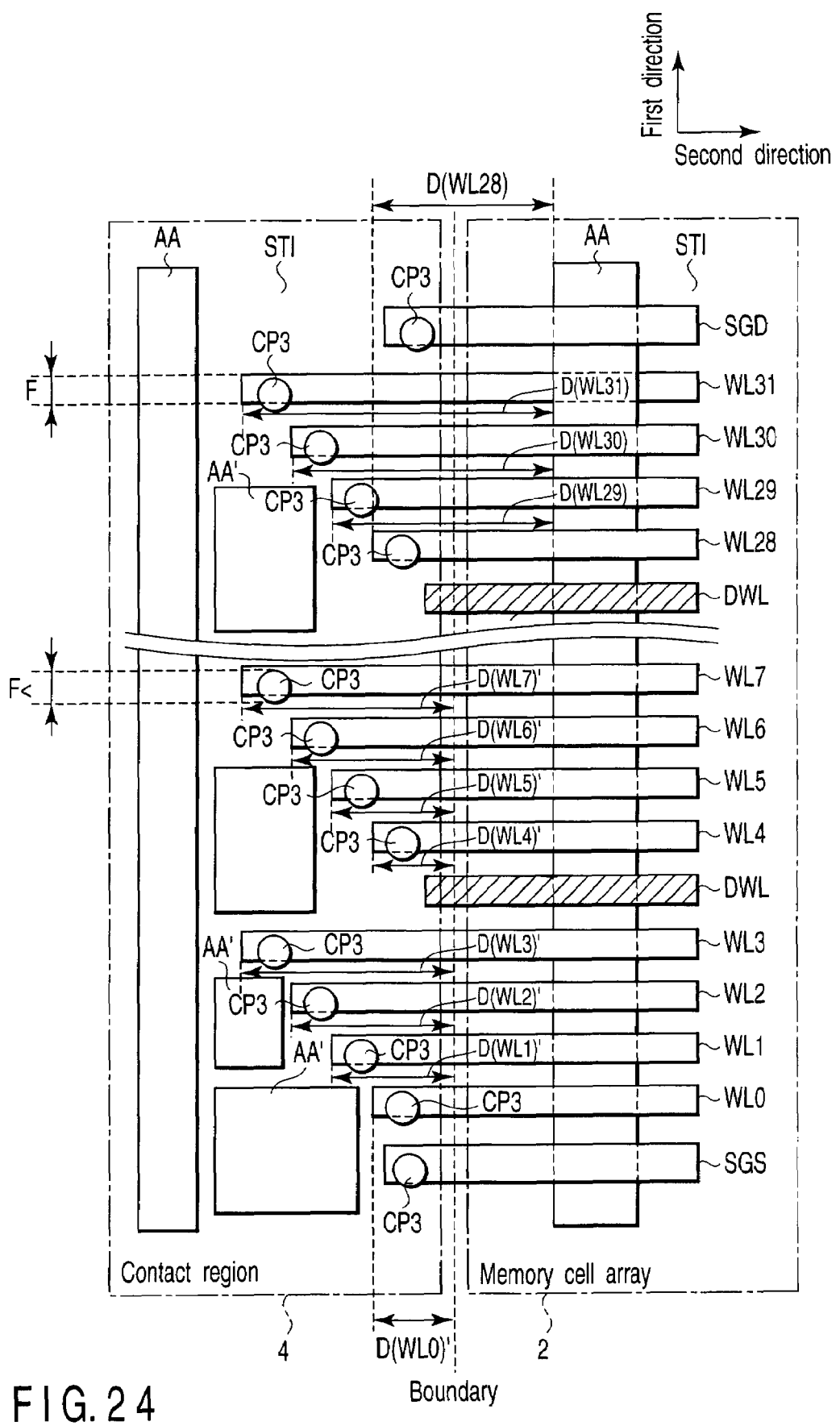
FIG. 24 is a plan view showing a memory cell array and a contact region which are included in a flash memory according to a fourth embodiment of the invention.

A semiconductor memory device according to a fourth embodiment of the present invention will be described below. In the fourth embodiment, a process margin is increased during the photolithography of the third embodiment by providing a dummy word line. FIG. 24 is a plan view showing the memory cell array 2 and contact region 4 in a NAND type flash memory according to the fourth embodiment, and particularly FIG. 24 shows a planar configuration of the word line WL.

As shown in FIG. 24, in the configuration of the fourth embodiment, strip-shaped dummy word lines DWL in the second direction are provided between the word lines WL3 and WL4, between the word lines WL7 and WL8, between the word lines WL11 and WL12, between the word lines WL15 and WL16, between the word lines WL19 and WL20, between the word lines WL23 and WL24, and between the word lines WL27 and WL28 in the configuration shown in FIG. 18 described in the third embodiment, while the strip-shaped dummy word lines DWL are parallel to the word line WL. That is, the dummy word line DWL is provided in the region between the groups having the one period of the third embodiment. In the memory cell array 2, for example, a dummy memory cell is formed in a region where the dummy word line DWL and the element region AA intersect each other. In this case, the voltage is applied to the dummy word line DWL in a region (not shown) such that the dummy memory cell is always turned on. The dummy word line DWL may be in the floating state in the case where the dummy memory cell is not formed, but the adjacent memory cell transistors MT are electrically connected while sandwiching the dummy memory cell in the first direction.

In the configuration of the fourth embodiment, the contact plug CP3 is formed such that the diameter of the contact plug CP3 is larger than the minimum processing dimension F. In this case, the diameter of the contact plug CP3 is larger than the line width of the word line WL. The contact plug CP3 is formed so as to be shifted from the center portion in the first direction of each word line WL. At this point, each contact plug CP3 is disposed closer to the side of the dummy word line DWL or the side of the word line WL whose length is short in the contact region 4 in the word lines WL adjacent to each other in the first direction. That is, the contact plugs CP3 on the word lines WL7 to WL5 are arranged closer to the word lines WL6 to WL4 in relation to the center of the word lines WL7 to WL5. The contact plug CP3 on the word line WL4 is disposed closer to the dummy word line DWL in relation to the center of the word line WL4.

In the contact region 4, the length in the second direction of the dummy word line DWL may be shorter than that of any of the word lines WL. This is because the dummy word line DWL is prevented from being short circuited with the contact plug CP3 on the adjacent word line WL.

Figure 25:
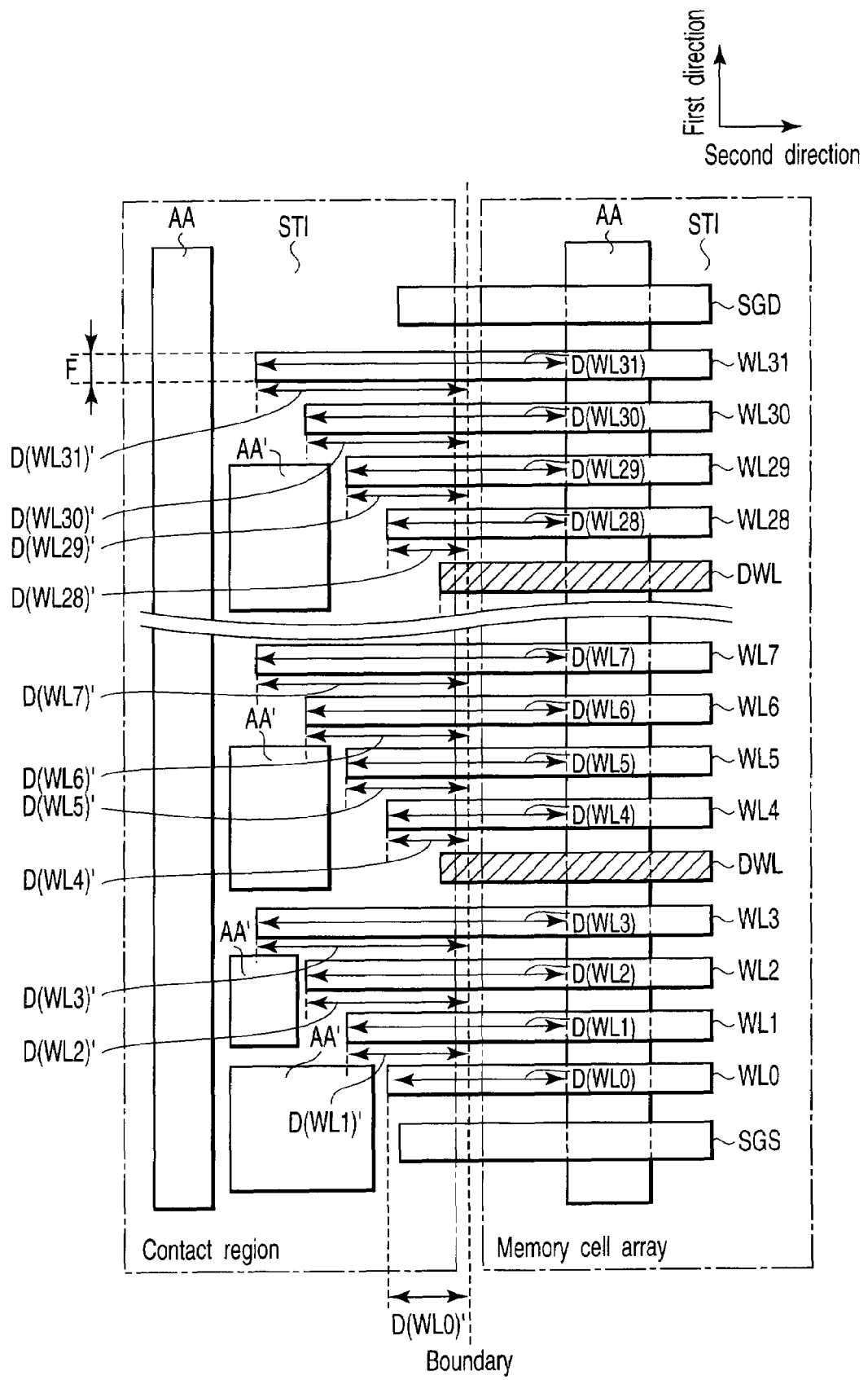
FIGS. 25 to 27 are sectional views showing first to third processes of producing the flash memory according to the fourth embodiment.
Figure 26:
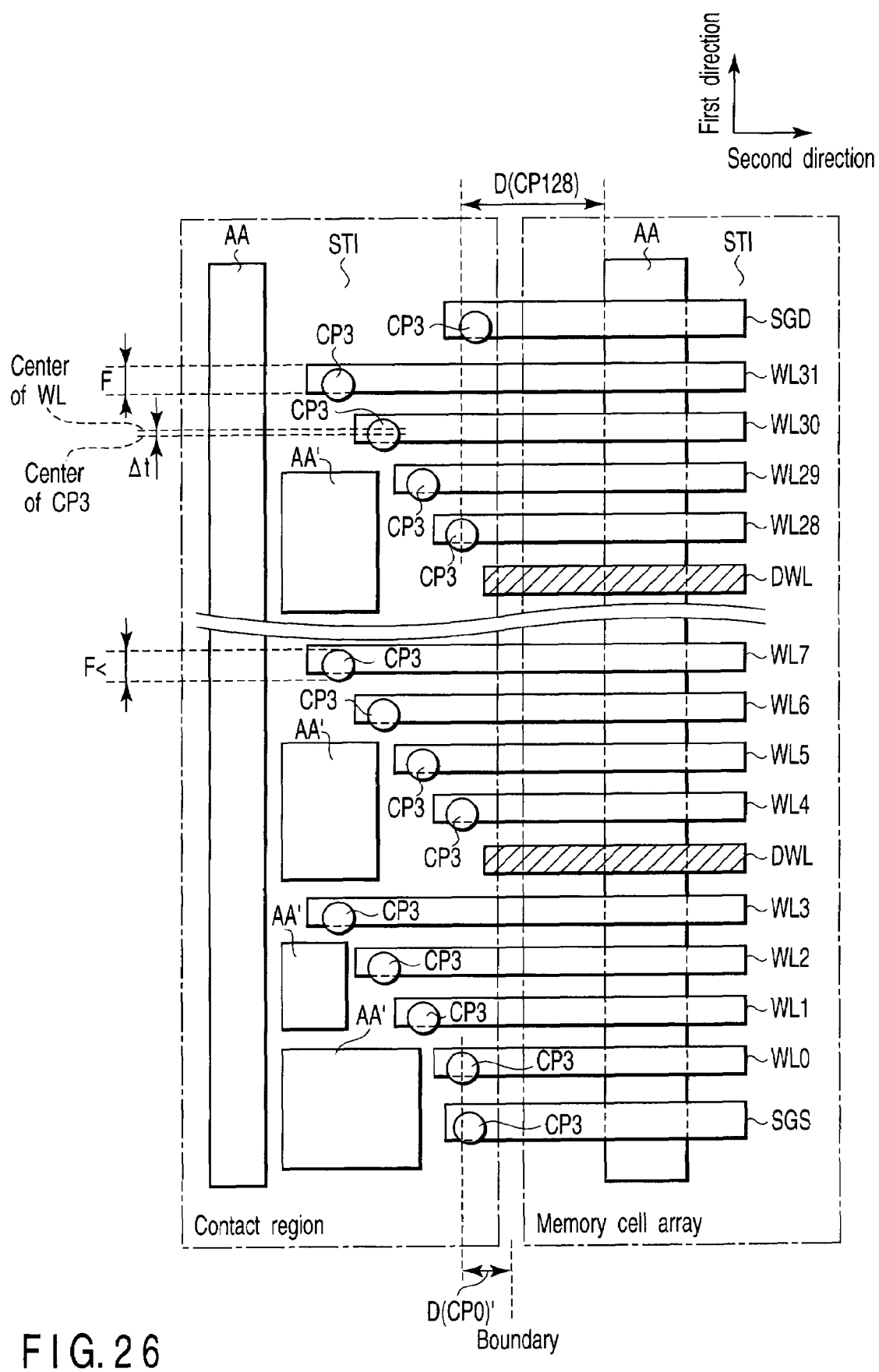
Figure 27:
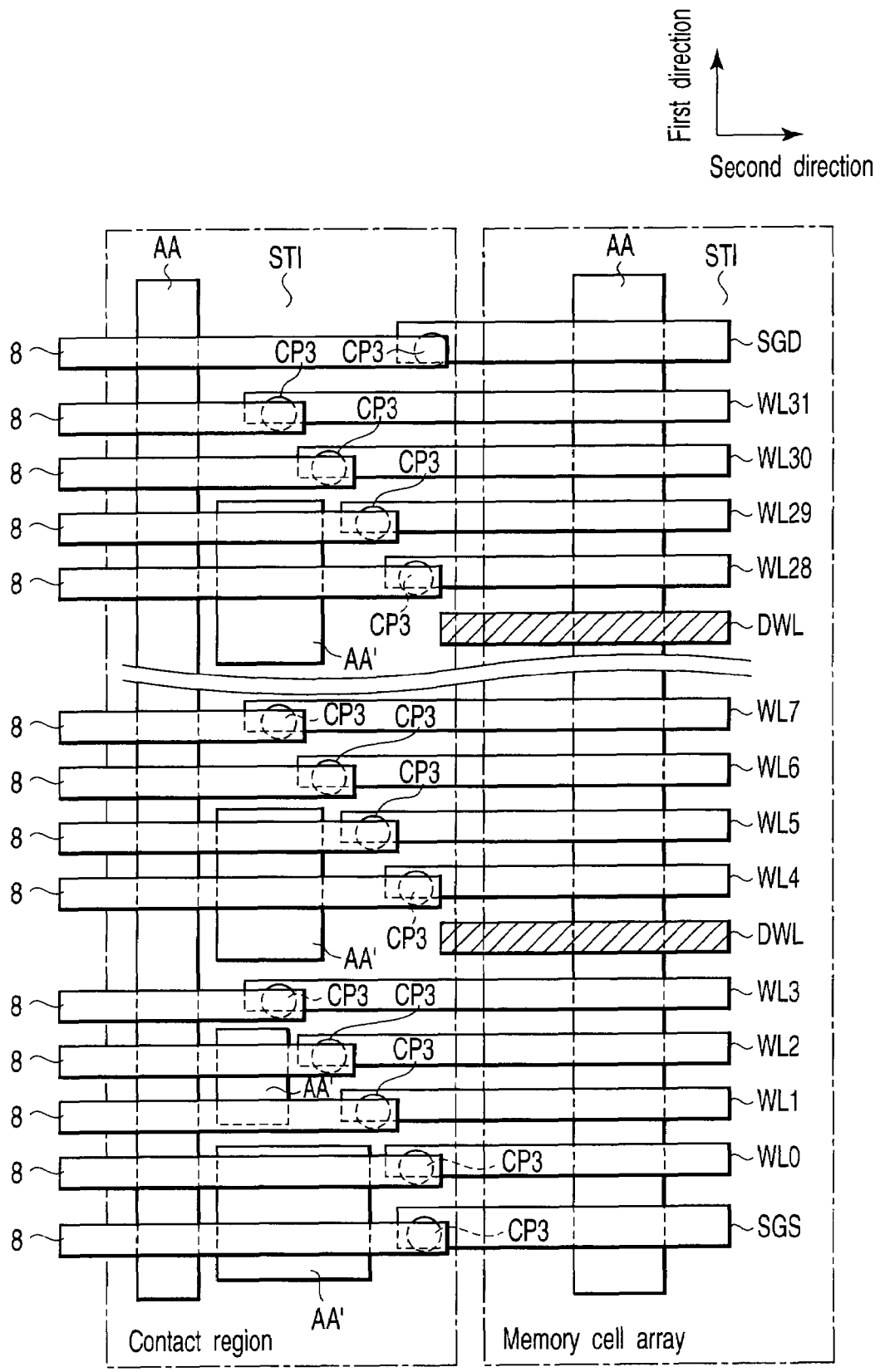

A method of producing the NAND type flash memory, in particular the contact region 4 will be described with reference to FIGS. 25 to 27. FIGS. 25 to 27 are sectional views sequentially showing processes of producing the memory cell array 2 and contact region 4, and FIGS. 25 to 27 correspond to the region shown in FIG. 24. In the following, only the method of processing the word line and the method of forming the contact plug CP3 will be described below. Other methods are similar to those of the first embodiment.

As shown in FIG. 25, the polycrystalline silicon layers 14 and 12 and the inter-gate insulating film 13 are etched using the photolithography technique and RIE. As a result, the word line WL, the select gate lines SGD and SGS, and the dummy word line DWL are formed. At this point, the widths of the word line WL and dummy word line DWL, the interval between the adjacent word lines WL, and the interval between the adjacent word line WL and dummy word line DWL are processed in the minimum processing dimension F of photolithography. The dummy word line DWL is formed so as to be shorter than both the two adjacent word lines WL in the first direction. The process of FIG. 25 is similar to that of FIG. 19 except that the dummy word line DWL is formed.

Then, as shown in FIG. 26, in the contact region 4, the contact plug CP3 is formed in the interlayer dielectric film 17 so as to reach the word line WL and select gate lines SGD and SGS. Similarly to the third embodiment, the contact plug CP3 is formed on the terminal portion of each of the word line WL and select gate lines SGD and SGS. At this point, the contact plug CP3 is formed such that the diameter of the contact plug CP3 is larger than the minimum processing dimension F and such that the center of the contact plug CP3 is shifted by $\Delta t$ from the center in the first direction of the word line WL. The contact plug CP3 is not formed on the dummy word line DWL. The process of FIG. 26 is similar to that of FIG. 20 except that the diameter of the contact plug is larger than the dimension F and the center position of the contact plug CP3 is shifted.

Then, as shown in FIG. 27, the metal interconnection layer 8 connected to the contact plug CP3 is formed on the interlayer dielectric film 17. The process of FIG. 27 is similar to that of FIG. 8 described in the first embodiment. The metal interconnection layer 8 may be connected to the contact plug CP3, and the line width may be equal to or larger than the minimum processing dimension F. Although the metal interconnection layer 8 is also provided so as to be shifted from the center of the contact plug CP3 in FIG. 27, the metal interconnection layer 8 may arbitrarily be provided as long as the metal interconnection layer 8 is in contact with the contact plug CP3.

Thus, in addition to effects (1) and (2), the following effect (3) is obtained in the semiconductor memory device according to the fourth embodiment.

(3) A margin can be increased for the connection between the word line WL and the contact plug CP3.

In the configuration of the fourth embodiment, the contact plug CP3 is formed larger than the minimum processing dimension F, which further facilitates the connection between the contact plug CP3 and the word line WL.

At this point, the center of the contact plug CP3 is shifted from the center of the word line WL such that the adjacent contact plugs CP3 are not short-circuited. The dummy word line DWL is provided in each one period in which the length of the word line is changed such that the adjacent metal interconnection layers 8 are not short-circuited. With this configuration, sufficient space can be ensured to form the metal interconnection layer 8.

Figure 28:
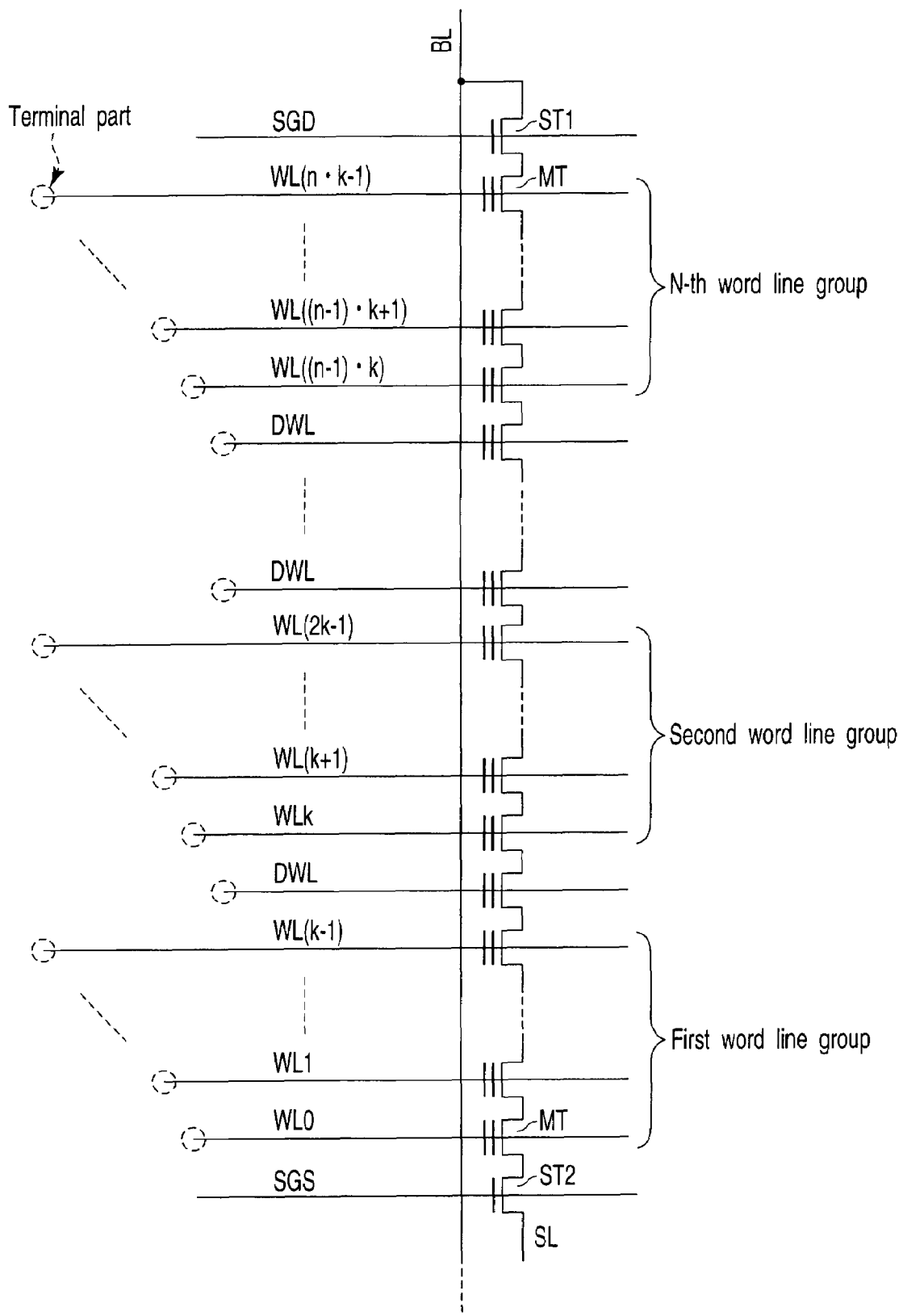
FIG. 28 is an equivalent circuit diagram showing a NAND string included in the flash memory according to the fourth embodiment.

In the fourth embodiment, similarly to the third embodiment, the four word lines constitute one period and the eight periods are repeated. However, the embodiment is not limited to the above embodiment. Another configuration will be described with reference to FIG. 28. FIG. 28 is a circuit diagram showing the NAND string of the fourth embodiment while paying attention to the position of the terminal portion of the word line.

AS shown to FIG. 28, as described in the third embodiment, the plural word lines WL connected to the same NAND string belong to any of the first word line group to the n-th word line group. k is the number of word lines belonging to each of the first word line group to the n-th word line group (k is a natural number of 3 or larger). Additionally, in the fourth embodiment, the dummy word line DWL is provided in the region between the i-th word line group (i is a natural number of any of 1 to (n−1)) and the (i+1)-th word line group. For example, the dummy word line DWL is provided between the first word line group (i=1) and the second word line group (i+1=2).

The length of dummy word line DWL is shorter than the two adjacent word lines WL in the first direction. For example, the dummy word line DWL between the first word line group and the second word line group is made shorter than the word line WL(k−1) and word line WLk.

Figure 29:
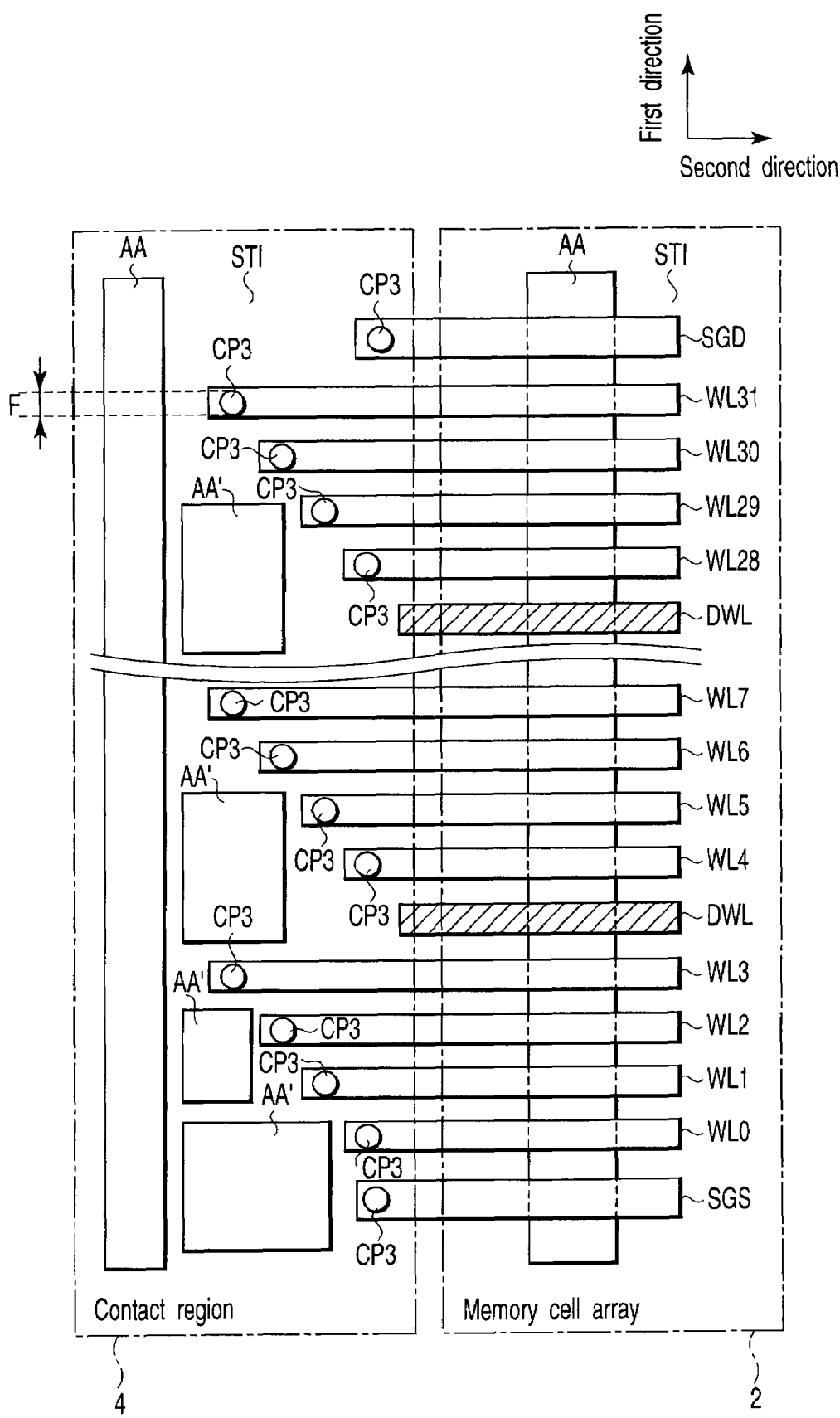
FIG. 29 is a plan view showing a memory cell array and a contact region which are included in a flash memory according to a modification of the fourth embodiment.

In the fourth embodiment, the diameter of the contact plug CP3 may be formed in the minimum processing dimension F. FIG. 29 is a plan view showing the memory cell array 2 and contact region 4 of a NAND type flash memory according to a modification of the fourth embodiment. As shown in FIG. 29, the diameter of the contact plug CP3 may be formed in the minimum processing dimension F while the dummy word line DWL is provided.

Thus, in the NAND type flash memory according to the first to fourth embodiments, the contact plugs CP3 connecting the word line WL and the metal interconnection layer 8 connected to the row decoder 3 are arranged in a zigzag or sawtooth manner. Accordingly, the word line can be shortened in the contact region 4. As a result, the area of the contact region 4 is reduced and the chip size can be reduced.

In the third and fourth embodiments, as shown in FIGS. 22 and 28, the word line close to the select gate line SGD is longer than the word line close to the select gate line SGS in each word line group. However, as shown in a circuit diagram of a NAND string of FIG. 30, the positions of the select transistors ST1 and ST2 may be replaced. That is, in each word line group, the word line close to the select gate line SGS may be longer than the word line close to the select gate line SGD.

Figure 30:
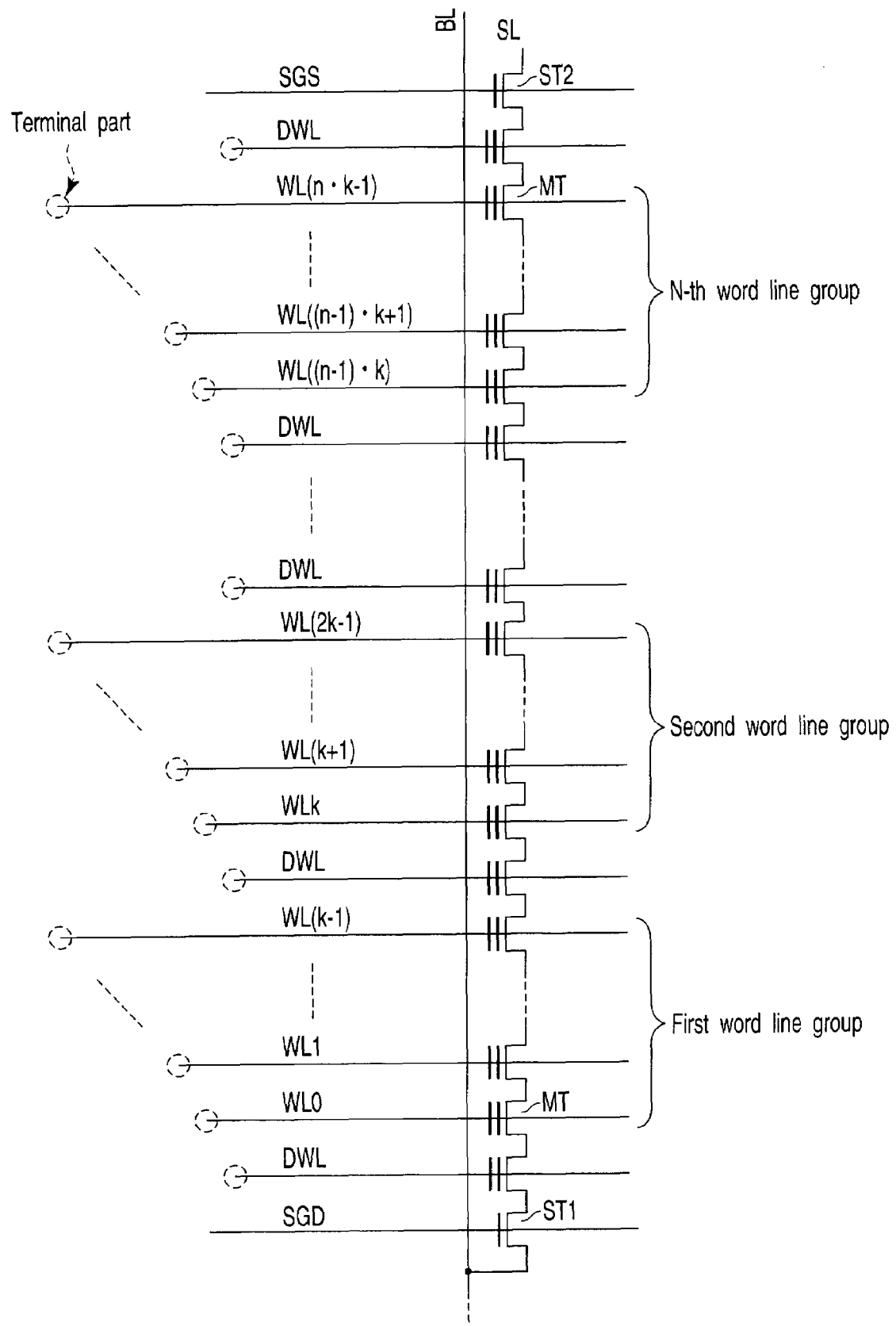
FIG. 30 is an equivalent circuit diagram showing a NAND string included in the flash memory according to modifications of the third and fourth embodiments.

As shown in FIG. 30, the dummy word lines DWL may be provided between the select gate line SGD and the word line (word line WL0 in FIG. 30) located in the end portion on the drain side of the NAND string and/or between the select gate line SGS and the word line (word line WL (n·k−1) in FIG. 30) located in the end portion on the source side of the NAND string. In FIGS. 28 and 30, one dummy word line DWL is provided between the word line groups. However, at least two dummy word lines DWL may be provided. The plural dummy word lines DWL may commonly be connected in a region (not shown) to form a common dummy word line.

In the above embodiments, the NAND type flash memory with floating gates is described by way of example. However, above embodiments are not limited to the NAND type flash memory with floating gates. For example, the embodiments can be applied to a NAND type flash memory with MONOS structure (without floating gates), or a Memory which consists of series connected memory cells each having a transistor having a source terminal and a drain terminal and a ferroelectric capacitor in between said two terminals, hereafter named "Series connected TC unit type ferroelectric RAM".

The memory cell unit of the Series connected TC unit type ferroelectric RAM has the following configuration. The memory cell unit includes plural series-connected memory cells and a block select transistor. The memory cell includes a cell transistor and a ferroelectric capacitor. One of electrodes of the ferroelectric capacitor is connected to the source of the cell transistor, and the other electrode is connected to the drain of the cell transistor. On the one hand, the source of the cell transistor is connected to the drain of the cell transistor of the adjacent memory cell, and on the other hand, the drain is connected to the source of the cell transistor of the adjacent memory cell. The gates of the plural cell transistors included in the memory cell unit are connected to the word lines WL respectively. In the memory cell unit, the drain of the cell transistor of the memory cell located closest to the drain is connected to the bit line through the current path of the block select transistor. In the memory cell unit, the source of the cell transistor of the memory cell located closest to the source is connected to a plate line.

In the above-described configuration, the configuration of the first to fourth embodiments can be applied to the plural word lines connected to the same memory cell unit and the contact plug formed on the word line.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    memory cells each of which includes a stacked gate and a current path, the stacked gate including a charge accumulation layer and a control gate, the charge accumulation layer being formed on a semiconductor substrate with a first insulating film interposed therebetween, the control gate being formed on the charge accumulation layer with a second insulating film interposed therebetween;
    a memory cell array in which the memory cells are arranged such that the current path of each of the memory cells is provided in the first direction;
    a contact region which is adjacent to the memory cell array in a second direction orthogonal to the first direction, the contact region including an element insulating region formed on the semiconductor substrate, a terminal portion on one end of the control gate being drawn onto the element insulating region from within the memory cell array; and
    first contact plugs which are formed on respective ones of the control gates located on the element insulating region in the contact region, the first contact plugs being located so as to alternately sandwich a first axis in the first direction in the contact region.

2. The device according to claim 1, wherein the terminal portions on one end of the control gate of the memory cells are located so as to alternately sandwich a second axis in the first direction in the contact region.

3. The device according to claim 1, wherein the terminal portions on one end of the control gate of the memory cells are located on a third axis in the first direction in the contact region.

4. The device according to claim 1, further comprising
    a decoder which is located adjacent to the memory cell array across the contact region; and
    interconnection layers which connect the first contact plugs to the decoder,
    wherein the decoder applies a voltage to the control gate through the interconnection layers and the first contact plugs.

5. The device according to claim 4, wherein a line width of each of the interconnection layers is larger than a line width of the control gate.

6. The device according to claim 4, wherein each of the interconnection layers includes
    a first interconnection layer which is connected to one of the first contact plugs located on the memory cell array side in relation to the first axis; and
    a second interconnection layer which is connected to one of the first contact plugs located on the decoder in relation to the first axis, and the first interconnection layer is provided at a level higher than a level of the second interconnection layer.

7. The device according to claim 4, wherein each of the interconnection layers includes a first interconnection layer which is connected to one of the first contact plugs located on the memory cell array side in relation to the first axis; and a second interconnection layer which is connected to one of the first contact plugs located on the decoder in relation to the first axis, and the first interconnection layer and the second interconnection layer are provided at the same level.

8. The device according to claim 1, further comprising a first select transistor which includes a source and a drain;

a second select transistor which includes a source and a drain;

a memory cell unit in which the memory cells are connected in series between the source of the first select transistor and the drain of the second select transistor; and a bit line which acts as a data transfer line, the bit line being connected to the drain of the first select transistor.

9. The device according to claim 8, further comprising a select gate line which is connected to the first select transistor and is formed along the second direction, a terminal portion on one end of the select gate line being drawn onto the element insulating region from an inside of the memory cell array; and a second contact plug which is formed on the select gate line located on the element insulating region in the contact region;

wherein a position related to the first direction of the second contact plug is shifted from a position related to the first direction of one of the contact plugs connected to one of the word lines adjacent to the select gate line.

10. A semiconductor memory device comprising:

memory cell transistors each of which includes a stacked gate and a current path, the stacked gate including a charge accumulation layer and a control gate, the charge accumulation layer being formed on a semiconductor substrate with a first insulating film interposed therebetween, the control gate being formed on the charge accumulation layer with a second insulating film interposed therebetween;

memory cell units in which the current paths of the memory cell transistors arrayed along a first direction are connected in series;

a memory cell array which includes the memory cell units;

word lines which are connected to respective ones of the control gates of the memory cell transistors in the memory cell unit, the word lines being formed along a second direction orthogonal to the first direction;

a contact region which is adjacent to the memory cell array in the second direction, the contact region including an element insulating region formed on the semiconductor substrate, a terminal portion on one end of the word lines being drawn onto the element insulating region from an inside of the memory cell array; and contact plugs which are formed on respective ones of the word lines located on the element insulating region in the contact region, each of the word lines connected to the same memory cell unit belonging to any of a first word line group to an n-th word line group (n is a natural number of 2 or larger), the word lines belonging to each of the first word line group to the n-th word line group being connected to the memory cell transistors sequentially arrayed in the first direction in the memory cell unit, in each of the first word line group to the n-th word line group, a distance to each of the contact plugs from a boundary between the memory cell array and the contact region being increased in the order in the first direction, one of the contact plugs whose the distance is minimum in the (i+1)-th word line group (i is a natural number of any of 1 to (n−1)) being formed on one of the word lines adjacent to one of the word lines on which one of the contact plugs whose the distance is maximum in an i-th word line group.

11. The device according to claim 10, wherein, in each of the first word line group to the n-th word line group, a distance from a terminal portion of the word lines to the boundary between the memory cell array and the contact region is made larger in the order in the first direction, and the distance with respect to the one of the word lines which belongs to the (i+1)-th word line group and is adjacent to one of the word lines whose the distance is maximum in the i-th word line group is minimum in the (i+1)-th word line group.

12. The device according to claim 10, further comprising a dummy word line which is formed in the second direction, the dummy word line being disposed in a region between the i-th word line group and the (i+1)-th word line group.

13. The device according to claim 10, wherein n is 3 or larger.

14. The device according to claim 10, further comprising a decoder which is located across the contact region from the memory cell array; and interconnection layers which connect the contact plugs to the decoder, wherein the decoder applies a voltage to the control gate through the interconnection layers and the contact plugs.

15. The device according to claim 14, wherein the interconnection layers are located at the same level.

16. The device according to claim 14, further comprising a dummy element region which is formed in a region between the control gate and the decoder in the contact region.

17. The device according to claim 12, wherein a diameter of the contact plugs is larger than a line width of the word lines.

18. The device according to claim 17, wherein a center position of the contact plugs is different from a center position in the first direction in each of the word lines.

* * * * *

UNITED STATES PATENT AND TRADEMARK OFFICE
CERTIFICATE OF CORRECTION

| | | |
|---|---|---|
| PATENT NO. | : 7,643,345 B2 | Page 1 of 1 |
| APPLICATION NO. | : 11/961398 | |
| DATED | : January 5, 2010 | |
| INVENTOR(S) | : Ishibashi | |

It is certified that error appears in the above-identified patent and that said Letters Patent is hereby corrected as shown below:

On the title page, Item (30), the Foreign Application Priority Data has been omitted. Item (30) should read:

-- (30)    Foreign Application Priority Data

Dec. 27, 2006   (JP).......................................2006-353420 --

Signed and Sealed this

Sixth Day of April, 2010

David J. Kappos
*Director of the United States Patent and Trademark Office*